(12) United States Patent
Lee et al.

(10) Patent No.: US 7,409,031 B1
(45) Date of Patent: Aug. 5, 2008

(54) DATA SAMPLING METHOD AND APPARATUS WITH ALTERNATING EDGE SAMPLING PHASE DETECTION FOR LOOP CHARACTERISTIC STABILIZATION

(75) Inventors: Bong-Joon Lee, Seoul (KR);
Moon-Sang Hwang, Yong-In-Si (KR);
Sang-Hyun Lee, Cupertino, CA (US);
Deog-Kyoon Jeong, Seoul (KR)

(73) Assignee: Silicon Image, Inc., Sunnyvale, CA (US)

( * ) Notice: Subject to any disclaimer, the term of this patent is extended or adjusted under 35 U.S.C. 154(b) by 742 days.

(21) Appl. No.: 10/642,259

(22) Filed: Aug. 15, 2003

Related U.S. Application Data

(60) Provisional application No. 60/416,017, filed on Oct. 4, 2002.

(51) Int. Cl.
*H03D 3/24* (2006.01)
(52) U.S. Cl. .................. 375/376; 375/375; 375/371
(58) Field of Classification Search ............... 375/375, 375/376, 354, 355, 371, 373, 374
See application file for complete search history.

(56) References Cited

U.S. PATENT DOCUMENTS

| | | | | |
|---|---|---|---|---|
| 5,485,125 A | * | 1/1996 | Dufour | 331/17 |
| 5,604,775 A | * | 2/1997 | Saitoh et al. | 375/376 |
| 5,945,855 A | * | 8/1999 | Momtaz | 327/157 |
| 2002/0027457 A1 | * | 3/2002 | Chang | 327/112 |

OTHER PUBLICATIONS

Savoj, J. et al., "A 10-Gb/s CMOS Clock and Data Recovery Circuit with a Half-Rate Linear Phase Detector" *IEEE Journal of Solid-State Circuits*, vol. 36, No. 5, May 2001, pp. 761-767.

Lee, Sang-Hyun, et al., "A 5Gb/s 0.25μm CMOS Jitter-Tolerant Variable-Interval Oversampling Clock/Data Recovery Circuit," *2002 IEEE International Solid-State Circuits Conference*, Digest of Technical Papers, pp. 256-257 and 465 (Feb. 2002).

Moon, Yongsam, et al., "A 0.6—2.5Gbaud CMOS Tracked 3x Oversampling Transceiver with Dead-Zone Phase Detection for Robust Clock/Data Recovery," *2001 IEEE International Solid-State Circuits Conference*, Digest of Technical Papers, pp. 212-213 and 448 (Feb. 2001).

(Continued)

*Primary Examiner*—Chieh M. Fan
*Assistant Examiner*—Jaison Joseoh
(74) *Attorney, Agent, or Firm*—Girard & Equitz LLP

(57) ABSTRACT

A method and apparatus for 2× oversampling of data having jitter. In some embodiments, the invention is a clock and data recovery device including an alternating edge sampling binary phase detector, and which is configured to stabilize loop characteristics in various jitter environments and can be implemented with small hardware overhead. A transceiver that embodies the invention can be implemented as a CMOS integrated circuit using a 0.18 μm CMOS process, with the transceiver chip being capable of recovering data having a data rate of up to 11.5 Gbps from a signal received over a serial link, while consuming no more than 540 mW from 1.8V supply, and with a bit error rate of less than $10^{-12}$.

36 Claims, 14 Drawing Sheets

OTHER PUBLICATIONS

Green, M, et al., "OC-192 Transmitter in Standard 0.18μm CMOS," *2002 IEEE International Solid-State Circuits Conference*, Digest of Technical Papers, pp. 248-249 (Feb. 2002).

Fiedler, A., et al., "A 1.0625Gbps Transceiver with 2x-Oversampling and Transmit Signal Pre-Emphasis," *1997 IEEE International Solid-State Circuits Conference*, Digest of Technical Papers, pp. 238-239 (Feb. 1997).

Larsson, Patrik, "A 2-1600-MHz CMOS Clock Recovery PLL with Low-Vdd Capability," *IEEE Journal of Solid-State Circuits*, vol. 34, No. 12, Dec. 1999, pp. 1951-1960.

* cited by examiner

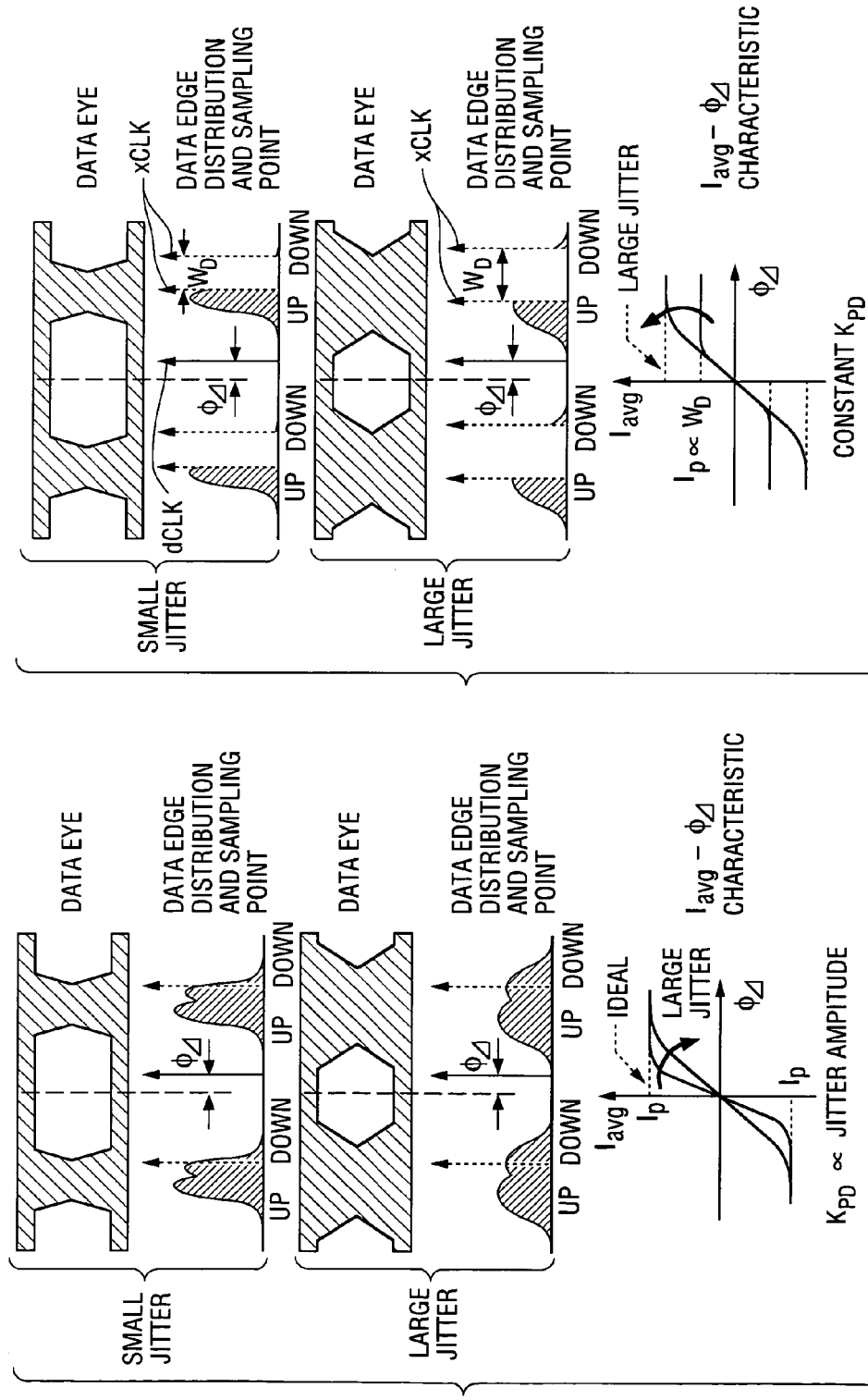

DATA SAMPLING METHOD AND APPARATUS WITH ALTERNATING EDGE SAMPLING PHASE DETECTION FOR LOOP CHARACTERISTIC STABILIZATION

CROSS-REFERENCE TO RELATED APPLICATION

This application claims the benefit of U.S. Provisional Application No. 60/416,017, filed Oct. 4, 2002, entitled "A 2.5-10 GBPS CMOS TRANSCEIVER WITH ALTERNATING EDGE SAMPLING PHASE DETECTION FOR LOOP CHARACTERISTIC STABILIZATION."

FIELD OF THE INVENTION

The invention pertains to clock and data recovery devices (CDRs), and to methods and circuitry for sampling data received over high speed links (e.g., high speed serial links).

BACKGROUND OF THE INVENTION

The term "receiver" is used herein in a broad sense to denote any device capable of receiving and decoding data that has been transmitted over a serial link or other link (and optionally also performing additional functions, which can include decrypting the received data and other operations related to decoding, reception, or decryption of the received data). For example, the term receiver can denote a transceiver that performs the functions of a transmitter as well as the functions of a receiver.

The term "CDR" is used herein to denote a clock and data recovery device. Typically, a receiver includes a CDR. Throughout the disclosure, CDRs are described as devices that receive "data" and generate at least one sequence of samples of the data. It should be understood that the "data" can be a signal indicative of a clock, or a signal indicative of an arbitrary sequence of binary bits of data. Some CDRs include circuitry for recovering both a clock and data from one or more received signals. A "CDR," as the term is used herein (including in the claims) need not include circuitry for recovering both a clock and data from one or more received signals.

The expression "phase detector" is used herein to denote a circuit that determines the phase error ($\phi_A$) present between a sampling clock and data (being sampled by the clock). A phase detector ("PD") is thus useful with a data sampling circuit including a feedback loop for controlling the phase of a sampling clock.

It should be understood that when phase error ($\phi_A$), between a sampling clock and a data signal being sampled using the clock, is expressed herein in degrees, the quantity "360 degrees" corresponds to one bit time of the data signal (with "bit time" being synonymous with "bit period" and denoting the inverse of the bit rate) and typically does not correspond to one period of the sampling clock. Typically, a sampling clock employed in accordance with the invention (e.g., data sampling clock "dCLK" or edge sampling clock "xCLK" discussed below) has frequency equal to f/N, where "f" is the bit rate of the data signal being sampled and N is an integer greater than one (for example, N=4 or N is another small integer). It should also be understood that when a clock is referred to herein as being "X" degrees out of phase with respect to another clock having the same frequency (e.g., when a raw edge sampling clock is said to be 180 degrees out of phase with a raw data sampling clock), the quantity "360 degrees" corresponds to one bit time of a data signal being sampled using the clocks, and typically does not correspond to one period of either one of the clocks. For example, in the below-described preferred implementation of the FIG. 3(a) system, raw data sampling clock "idCLK[0]" and raw edge sampling clock "ixCLK[0]" are referred to as being 180 degrees out of phase with respect to each other because clock "ixCLK[0]" lags clock "idCLK[0]" by one half of a bit time, and "ixCLK[0]" and raw edge sampling clock "idCLK[1]" are 180 degrees out of phase with respect to each other because clock "idCLK[1]" lags clock "ixCLK[0]" by one half of a bit time.

The expression "binary phase detector" is used herein to denote a circuit that determines whether the phase error ($\phi_A$) present between a sampling clock and data (being sampled by the clock) is positive or negative, without determining the magnitude of the phase error.

A binary phase detector (binary PD) based on a 2× oversampling technique has been widely used in transceivers (for receiving data transmitted over high speed serial links) due to its simple structure. A transceiver including such a PD is described in the paper by A. Fiedler, et al., entitled "A 1.0625 Gbps Transceiver with 2×-Oversampling and Transmit Signal Pre-Emphasis," ISSCC Digest of Technical Papers, pp. 238-239, February 1997. However, the loop characteristics of a CDR using such a binary PD are dependent on the jitter amplitude of the input data stream and the CDR might not be robust over a wide range of jitter amplitude. An example of this uncertainty is illustrated in FIG. 1(a), which includes data eye diagrams, 2× based sampling clocks, edge distribution diagrams, and $I_a$–$\phi_A$ curves for large and small amounts of jitter (where $I_{avg}$ denotes average pumping current), assuming that some phase error ($\phi_A$) is present between the sampling clocks and data. Typically, a CDR including a binary PD asserts a positive charge pump current ($I_P$) to cause advancement of the sampling clock phase when the sampling clock lags the data, and a negative charge pump current ($-I_P$) to cause retardation of the sampling clock phase when the sampling clock leads the data. Ideally (i.e., in the absence of jitter), the average pumping current ($I_{avg}$) is equal to the charge pump current ($I_P$) when the sampling clock lags the data and the average pumping current ($I_{avg}$) is equal to the negative charge pump current ($-I_P$) when the sampling clock leads the data. However, in a real world application in which there is high frequency jitter, the absolute value of the average pumping current ($I_{avg}$) is less than the absolute value of the charge pump current (when the sampling clock leads or lags the data) since the binary PD makes an up/down decision (a decision as to whether to increase or decrease the sampling clock phase) per each data transition and $I_{avg}$ is proportional to an average difference of the up/down decisions (represented by the shaded area in FIG. 1(a)). Therefore, for the same charge pump current, larger jitter reduces the absolute magnitude of the average pumping current and reduces the gain $K_{PD}$ (the slope of the $I_{avg}$ versus $\phi_A$ curve). So, the gain $K_{PD}$ and the absolute magnitude of $I_{avg}$ are inversely proportional to the amount of jitter, as indicated by the bottom graph in FIG. 1(a).

It should be understood that the expression "average" pumping current ($I_{avg}$) herein denotes an average of instantaneous values of the charge pump current over a time interval in which averaged phase error (averaged $\phi_A$) is positive or negative; not a time interval over which averaged phase error (averaged $\phi_A$) is zero. An average of instantaneous values of charge pump current, over a time interval in which averaged phase error (averaged $\phi_A$) is zero, would be zero (or nearly zero) and would typically be neither proportional nor inversely proportional to the amount of jitter.

The unstable gain ($K_{PD}$) due to jitter variation, of a conventional CDR that includes a binary PD based on a 2× oversampling technique as described with reference to FIG. 1(a), results in unreliable CDR loop characteristics.

Conventional CDRs that include 2× oversampling PDs do not support any method to measure jitter. Estimation of jitter can be accomplished in accordance with the invention using a modified version of the "dead zone" PD described in Y. Moon, et al., "A 0.6-2.5 Gbaud CMOS Tracked 3× Oversampling Transceiver with Dead Zone Phase Detection for Robust Clock/Data Recovery," ISSCC Digest of Technical Papers, pp. 212-213, February 2001, and in S. Lee, et al., "A 5 Gb/s 0.25 µm CMOS Jitter-Tolerant Variable-Interval Oversampling Clock/Data Recovery Circuit," ISSCC Digest of Technical Papers, pp. 256-257, February 2002. Because the dead zone PD described in the cited papers by Moon, et al. and Lee, et al. is based on 3× oversampling, a CDR including the dead zone PD must employ 3× oversampling and thus requires more hardware to implement and consumes more power than does a CDR that employs 2× oversampling. The noted problems of the prior art can be overcome in accordance with the invention by using a CDR that employs 2× oversampling, has reliable CDR loop characteristics, and includes an embodiment of the inventive alternating edge sampling phase detector ("AES PD") which establishes a dead zone.

SUMMARY OF THE INVENTION

In a class of embodiments, the invention is a clock and data recovery device (CDR) that includes a binary phase detector (binary PD), employs a 2× oversampling technique, and is not subject to unstable gain ($K_{PD}$) due to jitter variation. The inventive CDR includes a data loop configured to generate at least one sampling clock in response to a charge pump current $I_P$ having an average value $I_{avg}$, and is configured to generate the charge pump current $I_P$ in response to feedback indicative of phase error ($\phi_A$) between the sampling clock and the data being sampled and also indicative of the amount of the jitter of the data being sampled. The relation between $I_{avg}$ and $\phi_A$ is typically such that the "$I_{avg}$ versus $\phi_A$" curve has a linear portion (at small values of $\phi_A$) and the data loop gain $K_{PD}$ is the slope of this linear portion. A constant gain $K_{PD}$ (independent of the amount of the data's jitter) is achieved in accordance with the invention by adjusting the charge pump current $I_P$ to track amount of the jitter. Preferably, the CDR includes a jitter estimating circuit and is configured to make the absolute value of $I_P$ proportional to the amount of the jitter, thereby causing the average pumping current ($I_{avg}$) and data loop gain ($K_{PD}$) to be at least substantially independent of the amount of the jitter.

In preferred embodiments, the inventive CDR is an alternating edge sampling CDR that includes a frequency acquisition loop, a data loop, and a dead zone width control loop. At power-on, the frequency acquisition loop is activated to set the CDR operation frequency to match (e.g., within the range of ±200 ppm) an external reference clock frequency. After frequency lock is obtained, the data loop and dead zone width control loop are activated.

In some embodiments, the data loop includes sampling circuitry configured to generate data samples by sampling an input data signal (typically indicative of a sequence of input data bits) using a data sampling clock whose frequency is equal to the input data rate (where "input data rate" denotes the rate of occurrence of the "one" and "zero" bits indicated by the input data signal). In other embodiments, the data loop includes sampling circuitry configured to generate N sequences of data samples (where N is an integer greater than one) using a set of N data sampling clocks, all having the same frequency but each having a different phase than each of the other data sampling clocks. In the latter embodiments, each sequence of data samples is generated by sampling the input data signal using a different one of the data sampling clocks, and the frequency of each data sampling clock is equal to R/N, where R is the input data rate, and "input data rate" denotes the rate of occurrence of the "one" and "zero" bits indicated by the input data signal.

In each embodiment mentioned in the previous paragraph, the data loop preferably generates a raw data sampling clock, a raw edge sampling clock, and an edge sampling clock (for each data sampling clock), and generates the relevant data sampling clock by applying a delay to the raw data sampling clock (a fixed delay in the case that the input data signal has constant jitter), adjusts the phase of the data sampling clock to the center of the data eye, and keeps the raw edge sampling clock 180 degrees out of phase with the raw data sampling clock. Preferably, the data loop includes circuitry (sometimes referred to herein as an alternating edge sampling phase detector or "AES PD") which generates the edge sampling clock by applying a sequence of small positive and negative offsets to the raw edge sampling clock (a positive offset is applied when the AES PD is in an "UP" state, and a negative offset is applied when the AES PD is in a "DOWN" state), in the sense that in the UP state it delays the raw edge sampling clock by slightly less than it delays the raw data sampling clock (to generate the data sampling clock) and in the DOWN state it delays the raw edge sampling clock by slightly more than it delays the raw data sampling clock (to generate the data sampling clock). Preferably, the data loop also generates clock phase control signals (feedback signals) in response to samples of the input data signal generated using the edge sampling clock and the data sampling clock. The phase difference between the edge sampling clock (with the positive offset) and the edge sampling clock (with the negative offset) is known as a "dead zone." The data loop controls the phase of the data sampling clock in response to the clock phase control signals. In typical embodiments, the data loop includes a voltage controlled oscillator (VCO) which generates the raw edge sampling clock and a raw data sampling clock, and charge pump circuitry which generates charge pump current $I_P$ (and a voltage, proportional to the charge pump current, for controlling the VCO) in response to the clock phase control signals.

In preferred embodiments, the data loop generates a raw data sampling clock (sometimes referred to herein as idCLK) and a raw edge sampling clock (sometimes referred to herein as ixCLK), generates a data sampling clock (sometimes referred to herein as dCLK) in response to the raw data sampling clock, adjusts the phase of the data sampling clock to the center of the data eye, keeps the raw edge sampling clock 180 degrees out of phase with the raw data sampling clock, and generates an edge sampling clock (sometimes referred to as xCLK) by applying a sequence of small positive and negative offsets to the raw edge sampling clock. Typically, the positive offset is applied to advance the phase of xCLK, relative to that of dCLK, when a control bit (e.g., "up_det" asserted by finite state machine 4 of FIG. 3(a)) indicates that the AES PD is in an "UP" state, and the negative offset is applied to retard the phase of xCLK relative to that of dCLK when the control bit indicates that the AES PD is in a "DOWN" state. Preferably, the data loop generates charge pump control bits (e.g., the bits "up[0:3]" and "down[0:3]" of FIG. 3(a)) in response to samples of the input data signal generated using the data sampling clock and the edge sampling clock, and charge pump and VCO circuitry of the data loop controls the phase of the raw data sampling and raw edge sampling clocks in response to the charge pump control bits.

The dead zone width control loop includes a jitter estimating circuit configured to generate a jitter signal indicative of the input data's jitter. In response to the jitter signal, the dead zone width control loop adjusts the width ($W_D$) of the dead zone defined by the edge sampling clock (e.g., controls the magnitude of the positive and negative offsets that the data loop applies to the raw edge sampling clock to generate the edge sampling clock), and preferably also controls the charge pump current ($I_P$). The dead zone width ($W_D$) is automatically adjusted during operation (in response to the jitter signal) to cause the edges of the dead zone to track the boundaries of the data eye, for example as indicated in FIG. 1(b). In FIG. 1(b), the data sampling clock dCLK has phase error $\phi_\Delta$ (relative to the center of the data eye), two versions of the edge sampling clock xCLK are shown (an "up" version having phase ($\phi-180+W_D/2$) degrees, and a "down" version having phase ($\phi-180-W_D/2$) degrees, where $\phi$ is the phase of dCLK), and the dead zone width $W_D$ is varied to be proportional to the amount of the data's jitter. In preferred embodiments, the charge pump current ($I_P$) is controlled in response to the jitter signal to cause the average pumping current ($I_{avg}$) and data loop gain ($K_{PD}$) to be at least substantially independent of amount of the jitter and the dead zone width.

In preferred embodiments, the jitter estimating circuit of the dead zone width control loop estimates input data jitter by counting (in the digital domain) the number of times that the data loop changes the phase of the raw data sampling clock (e.g., the number of charge pump control bits asserted with magnitude "up=1" or "down=1" by finite state machine 4 of FIG. 3(a)) during a predetermined number of valid input data transitions. The width of the dead zone is increased (or decreased) as this count increases (or decreases). To prevent interaction between the data loop and the dead zone width control loop, the bandwidth of the dead zone width control loop is preferably much smaller than that of the data loop.

When the raw edge sampling clock of preferred embodiments of the invention is locked to the data transition edge, the edge sampling clock samples data with positive or negative offset from the data transition edge. In these embodiments, the AES PD of the invention has two sampling states: an UP state and a DOWN state. In the UP state, the edge sampling clock samples data with positive offset with respect to the data transition edge (i.e., at the left boundary of the dead zone, as shown in FIGS. 1(b) and 4(a)) and the data sampling clock also samples the data. In the DOWN state, the edge sampling clock samples data with negative offset with respect to the data transition edge (i.e., at the right boundary of the dead zone) and the data sampling clock also samples the data. When locked to the input data, the AES PD of the invention undergoes a transition between the UP and DOWN state at every data transition. When not locked to the input data, the AES PD remains in a first one of the UP state and the DOWN state while the data loop adjusts the phase of the raw data sampling clock (and the raw edge sampling clock) to reduce the phase difference between the data sampling clock and the center of the data eye.

In preferred embodiments, the data loop adjusts the phase of the raw data sampling clock by asserting charge pump control signals (e.g., charge pump control bits "up[0:3]" and "down[0:3]" bits of FIG. 3(a)) indicative of the offset of the data sampling clock from the center of the data eye to charge pump circuitry that controls a VCO which generates the data sampling clock (e.g., charge pump circuitry 12 of FIG. 3(a) which controls VCO 20). In response, the current $I_P$ generated by the charge pump circuitry causes the VCO to advance (or retard) the phase of the raw data sampling clock when the charge pump control signals indicate that the phase of the data sampling clock lags (or leads) the data eye. The charge pump control signals are asserted to the jitter estimating circuit of the dead zone width control loop as well as to the charge pump circuitry of the data loop. For example, the charge pump control bits "up[0:3]" and "down[0:3]" bits of FIG. 3(a), which consist of bits $up_i$ and $down_i$ (where i=0, 1, 2, or 3, and "i" is indicative of one of the below-mentioned layers), are asserted to charge pump circuitry 12 and at least some of these bits are asserted to dead zone width control circuit 14. A stream of the $up_i$ and $down_i$ bits includes more $up_i=1$ and $down_i=1$ bits (per a predetermined number of data transitions) when the input data exhibits more jitter, and fewer $up_i=1$ and $down_i=1$ bits when the input data exhibits less jitter. In response to the charge pump control signals, the dead zone width control loop increases the dead zone width when the input data exhibits more jitter. When the dead zone widens, the data loop asserts fewer $up_i=1$ and $down_i=1$ bits (assuming that the jitter does not change) per the predetermined number of data transitions.

Other aspects of the invention are a binary phase detector (PD) for use in an embodiment of the inventive CDR, data loop circuitry for use in an embodiment of the inventive CDR, dead zone width control loop circuitry for use in an embodiment of the inventive CDR, and a jitter estimating circuit for use in a dead zone width control loop.

Another aspect of the invention is a method for sampling data having jitter, including the steps of: (a) generating at least one sampling clock in response to a charge pump current, where at least one said sampling clock is a data sampling clock and the charge pump current determines the phase of the data sampling clock; (b) generating data samples by sampling the data using the data sampling clock; and (c) generating the charge pump current in response to feedback, where the feedback is indicative of phase error between the data sampling clock and the data, the feedback is also indicative of the jitter, the charge pump current has an average current value that is at least substantially independent of the amount of the jitter over each time interval over which $\phi_{av}$ is nonzero, where $\phi_{av}$ is an average of instantaneous values of said phase error over the time interval, and the average current value is an average of instantaneous values of the charge pump current over said time interval. Typically, the charge pump current is a positive current ($I_P$) when the phase error is negative, the charge pump current is a negative current, $-(I_P)$, when the phase error is positive, and step (c) includes the step of controlling the absolute value of the charge pump current to cause said absolute value be proportional to the jitter. Preferably, another sampling clock generated during step (a) is a first clock whose phase is determined by the charge pump current, and step (c) includes the steps of: modulating the first clock to generate an edge sampling clock such that the edge sampling clock defines a dead zone having a dead zone width; generating additional samples of the data in response to the edge sampling clock; and generating the feedback in response to the data samples and the additional data samples. In some embodiments, the data determines a data eye, and step (c) includes the step of automatically adjusting the dead zone width to cause edges of the dead zone to track boundaries of the data eye.

BRIEF DESCRIPTION OF THE DRAWINGS

FIG. 1(a) includes data eye diagrams, edge distribution diagrams (showing conventional 2× based sampling clocks), and $I_{avg}$-$\phi_\Delta$ curves for large and small amounts of jitter (where $I_{avg}$ denotes average pumping current), assuming that phase error ($\phi_A$) is present between the sampling clocks and data.

FIG. 1(b) includes data eye diagrams, edge distribution diagrams (showing the inventive, phase-modulated 2× based sampling clocks dCLK and xCLK), and $I_{avg}$–$\phi_A$ curves for large and small amounts of jitter, assuming that phase error ($\phi_A$) is present between the sampling clocks and data.

DETAILED DESCRIPTION OF THE INVENTION

We sometimes refer to a circuit herein as a PD (e.g., an "alternating edge sampling PD") when it includes not only a circuit that determines the phase error ($\phi_A$) present between a sampling clock and data (being sampled by the clock), but also additional circuitry (e.g., data sampling circuitry). For example, alternating edge sampling phase detector ("AES PD") 2 of FIG. 3(a) includes data sampling circuitry (e.g., circuit 8) as well as circuitry for generating signals ("up[0:3]" and "down[0:3]") indicative of whether the data sampling clock employed by the data sampling circuitry leads or lags the data being sampled.

In a class of embodiments, the invention is a clock and data recovery device (CDR) that includes a binary phase detector (binary PD), employs a 2× oversampling technique, and is not subject to unstable gain ($K_{PD}$) due to jitter variation. The inventive CDR includes a data loop configured to generate sampling clocks in response to a charge pump current $I_P$ having an average value $I_{avg}$, and is configured to generate the charge pump current $I_P$ in response to feedback indicative of phase error ($\phi_A$) between the sampling clocks and the data being sampled and also indicative of jitter of the data being sampled. The relation between $I_{avg}$ and $\phi_A$ is typically such that the "$I_{avg}$ versus $\phi_A$" curve has a linear portion (at small values of $\phi_A$) and the gain $K_{PD}$ is the slope of this linear portion. A constant $K_{PD}$ (independent of the data's jitter) is achieved in accordance with the invention by adjusting the charge pump current $I_P$ to track the data's jitter. Preferably, the CDR includes a jitter estimating circuit and is configured to make the absolute value of $I_P$ proportional to the jitter, thereby causing the average pumping current ($I_{avg}$) and gain ($K_{PD}$) to be at least substantially independent of the jitter.

As elsewhere herein, the expression "average" pumping current ($I_{avg}$) denotes an average of instantaneous values of the charge pump current over a time interval in which averaged phase error, $\phi_{av}$ (where "$\phi_{av}$" is the average of instantaneous values of phase error $\phi_A$ over the time interval), is nonzero; not a time interval over which averaged phase error ($\phi_{av}$) is zero. An average of instantaneous values of charge pump current, over a time interval in which averaged phase error ($\phi_A$) is zero, would always be zero (or nearly zero) and would typically be neither proportional nor inversely proportional to the amount of jitter.

Figure 2A:
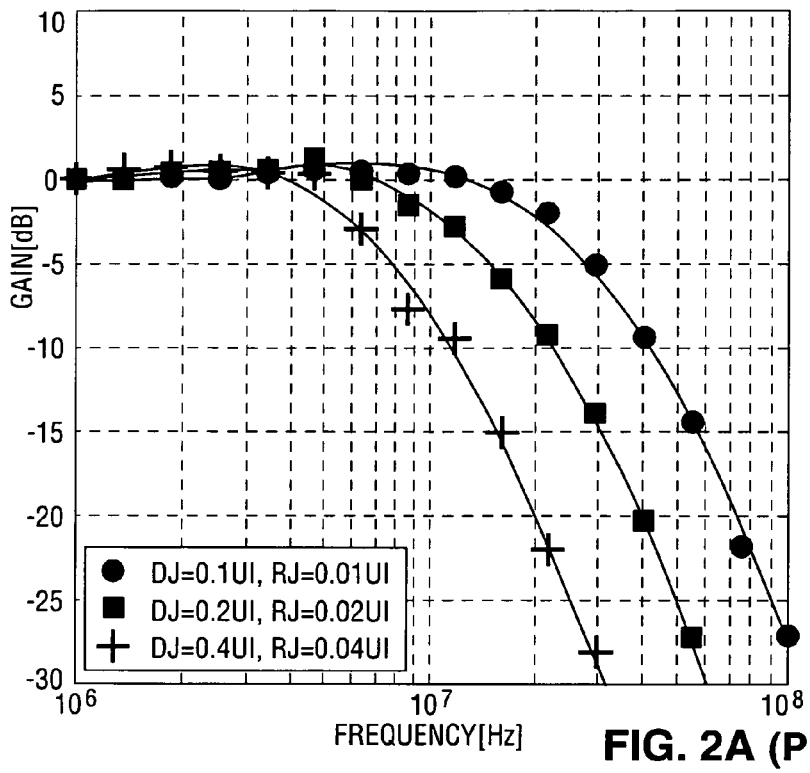
FIG. 2(a) is a graph showing three jitter transfer curves (each assuming a different amount of jitter) for a conventional CDR including a binary PD and based on a 2× oversampling technique.
Figure 2B:
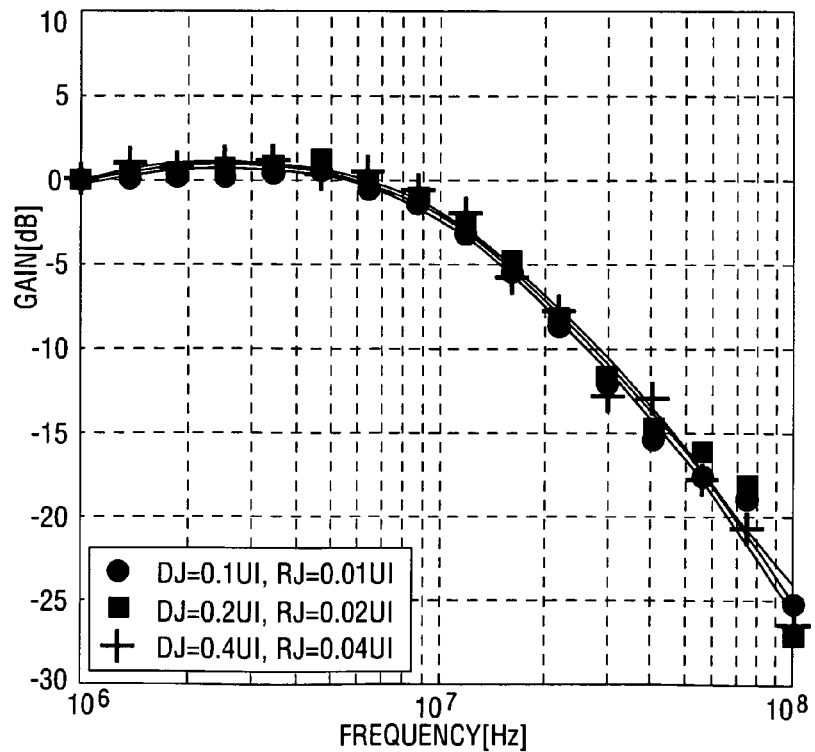
FIG. 2(b) is a graph showing three jitter transfer curves (each assuming one of the jitter amounts assumed in a corresponding curve in FIG. 2(a)) for an embodiment of the inventive CDR (which includes a binary PD and is based on a 2× oversampling technique).

An embodiment of the inventive CDR and a conventional CDR have been analyzed using a time-step simulator. A randomly generated data stream was fed to the conventional CDR (which included a conventional binary PD and was based on a 2× oversampling technique) and random and deterministic jitter (RJ and DJ) were added to the data stream. The resulting jitter transfer curves are plotted for some jitter corners in FIG. 2(a). A randomly generated data stream was also fed to the inventive CDR (which included an AES binary PD) and random and deterministic jitter (RJ and DJ) having the same characteristics were added to the data stream. The resulting jitter transfer curves are plotted for some jitter corners in FIG. 2(b). As shown in FIG. 2(b), the inventive CDR has a substantially constant transfer curve (independent of the amount of jitter). As shown in FIG. 2(a), the conventional CDR has very different transfer curves depending on the amount of jitter.

The details of a preferred embodiment of the invention will next be discussed below with reference to FIGS. 3(a), 3(b), 4(a), 4(b), 12(a), 12(b), and 13.

Figure 3A:
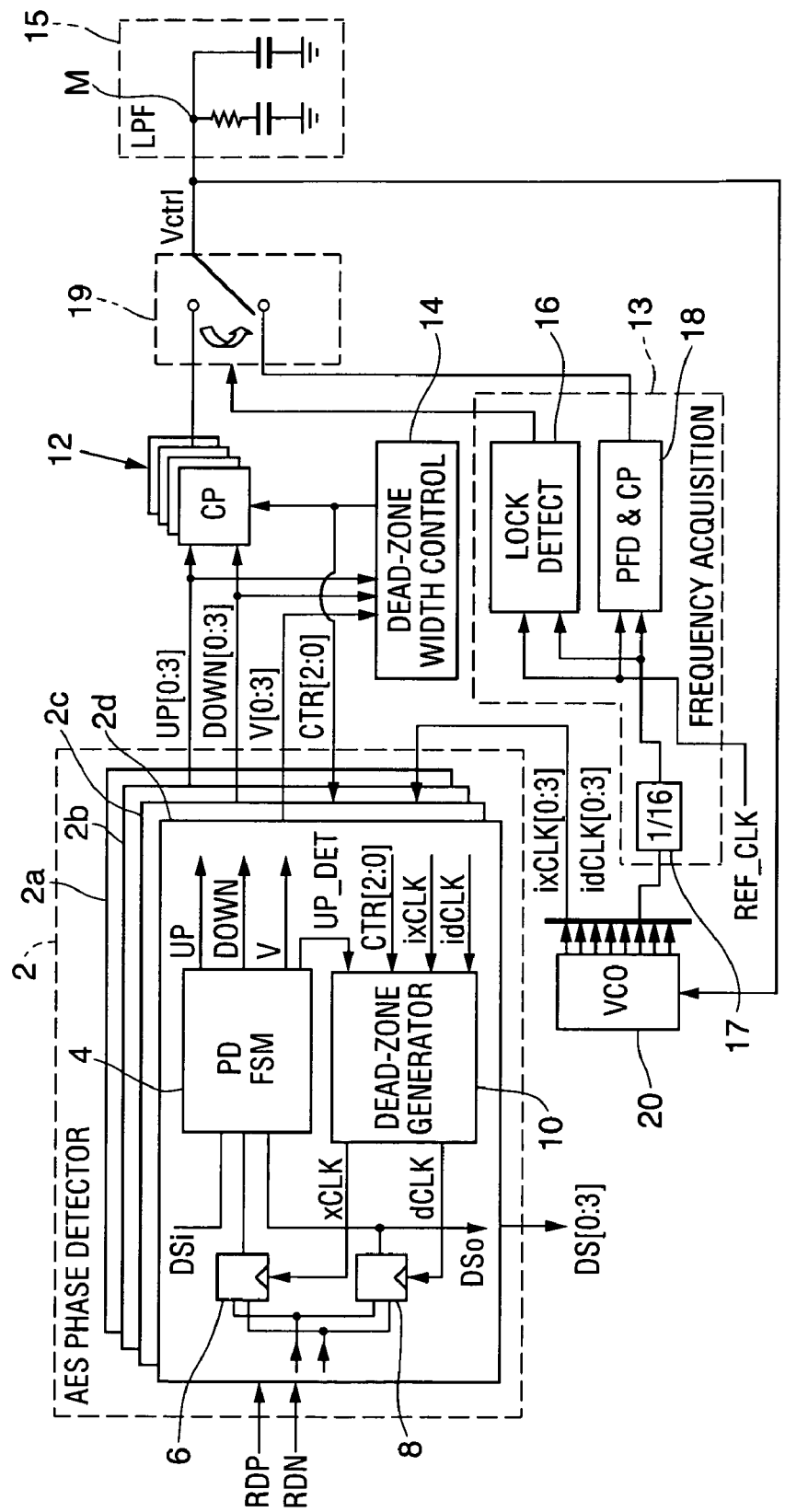
FIG. 3(a) is a block diagram of a CDR that embodies the invention and includes an alternating edge-sampling binary PD.

FIG. 3(a) is a block diagram of a CDR which includes an alternating edge sampling binary PD ("AES PD" 2). The CDR circuitry shown in FIG. 3(a) is composed of four circuits (to be referred to as "layers"), each coupled to receive the same differential input signal (RDP, RDN). Typically, the four layers operate in parallel and each layer operates at a different phase in the following sense. The first layer generates an adjusted data sampling clock (dCLK) in response to a first data sampling clock (idCLK[0]) from VCO 20, generates an adjusted edge sampling clock (xCLK) in response to a first edge sampling clock (ixCLK[0]) from VCO 20, and generates a stream of data samples DS[0] of the differential input signal using the first adjusted data sampling clock and the first adjusted edge sampling clock. The second layer generates a second adjusted data sampling clock (dCLK[1]) in response to a second data sampling clock, idCLK[1] (which is delayed by one bit time relative to the first data sampling clock) from VCO 20, generates a second adjusted edge sampling clock (xCLK[1]) in response to a second edge sampling clock, ixCLK[1] (which is delayed by one bit time relative to the first edge sampling clock) from VCO 20, and generates a stream of data samples DS[1] of the differential input signal using the second adjusted data sampling clock and the second adjusted edge sampling clock. The third layer generates a third adjusted data sampling clock (dCLK[2]) in response to a third data sampling clock, idCLK[2] (which is delayed by two bit times relative to the first data sampling clock) from VCO 20, generates a third adjusted edge sampling clock (xCLK[2]) in response to a third edge sampling clock, ixCLK[2] (which is delayed by two bit times relative to the first edge sampling clock) from VCO 20, and generates a stream of data samples DS[2] of the differential input signal using the third adjusted data sampling clock and the third adjusted edge sampling clock. The fourth layer generates a fourth adjusted data sampling clock (dCLK[3]) in response to a fourth data sampling clock, idCLK[3] (which is delayed by three bit times relative to the first data sampling clock) from VCO 20, generates a fourth adjusted edge sampling clock (xCLK[3]) in response to a fourth edge sampling clock, ixCLK[3] (which is delayed by three bit times relative to the first edge sampling clock) from VCO 20, and generates a stream of data samples DS[3] of the differential input signal using the fourth adjusted data sampling clock and the fourth adjusted edge sampling clock. The four data sample streams, denoted as "DS[0:3]" in FIG. 3(a), have a combined sample rate that is four times the sample rate of each individual stream (DS[0], DS[1], DS[2], or DS[3]).

One of the major merits of the invention is that it can easily be implemented with a parallel architecture (as is the FIG. 3(a) circuit). If a system that embodies the invention is implemented with a parallel architecture, it can operate at lower speed than if it were not implemented with a parallel architecture. For example, the preferred implementation of the FIG. 3(a) circuit generates data samples DS[0:3] with the same sample rate that could be attained by omitting three of its four layers and operating the remaining layer in response to data sampling and edge sampling clocks having frequency four times greater than the frequency (equal to 2.5 GHz, in one embodiment) of each of data sampling and edge sampling clocks idCLK[0:3] and ixCLK[0:3] of FIG. 3(a). In such a preferred implementation of the FIG. 3(a) circuit, for each value of i (where i=0, 1, 2, or 3), raw data sampling clock "idCLK[i]" and raw edge sampling clock "ixCLK[i]" are 180 degrees out of phase with respect to each other (in the sense that clock "ixCLK[0]" lags clock "idCLK[0]" by one half of a bit time. Similarly, for each value of i in the range $0 \leq i \leq 2$, "ixCLK[i]" and "idCLK[i+1]" are 180 degrees out of phase with respect to each other in the sense that "idCLK[i+1]" lags clock "ixCLK[i]" by one half of a bit time, and "ixCLK[3]" and "idCLK[0]" are 180 degrees out of phase with respect to each other in the sense that "idCLK[0]" lags clock "ixCLK[3]" by one half of a bit time.

The four layers of FIG. 3(a) are identical to each other. Circuit 2a of AES phase detector 2 belongs to the first layer, circuit 2b of AES phase detector 2 belongs to the second layer, circuit 2c of AES phase detector 2 belongs to the third layer, and circuit 2d of AES phase detector 2 belongs to the fourth layer. In typical operation, each of circuits 2a, 2b, 2c, and 2d, is coupled to receive the same differential input signal (RDP, RDN).

In variations on the FIG. 3(a) embodiment, the AES phase detector of the inventive CDR circuitry has a single layer that is coupled to receive one differential input signal (e.g., three of circuits 2a, 2b, 2c, and 2d are omitted), so that only a single raw data sampling clock (idCLK) is generated (and employed) and a single raw edge sampling clock (ixCLK) is generated and employed. In some such variations, the frequency of the raw data sampling clock (idCLK) and the frequency of the raw edge sampling clock (ixCLK) matches the bit rate.

With reference again to FIG. 3(a), AES phase detector 2 includes four identical data sampling circuits 6, four identical data sampling circuits 8, four identical finite state machines 4, and four identical dead zone generation circuits 10. Each of circuits 2a, 2b, 2c, and 2d includes one of the data sampling circuits 6, one of the data sampling circuits 8, one finite state machine ("PD FSM") 4, and one dead zone generation circuit 10, connected as shown. Some other elements of FIG. 3(a), such as voltage controlled oscillator ("VCO") 20 and charge pump circuitry 12, are shared by all four layers but generate separate output signals for each layer. For example, VCO 20 generates a different raw data sampling clock (idCLK[0], idCLK[1], idCLK[2], and idCLK[3]) for each layer and a different raw edge sampling clock (ixCLK[0], ixCLK[1], ixCLK[2], and ixCLK[3]) for each layer. For another example, circuitry 12 preferably includes four identical charge pump circuits, each for sourcing or sinking a current $I_P$ (to or from the capacitors of filter 15) to cause filter 15 to assert a low-pass-filtered voltage to VCO 20 to control VCO 20's generation of the raw data sampling clock and raw edge sampling clock for a different one of the layers.

Some other elements of FIG. 3(a) are shared by all four layers. Examples of such elements are dead zone width control circuit 14, switch 19, and frequency acquisition circuitry 13 (which generates a single control signal for switch 19 that is shared by all layers).

The FIG. 3(a) system includes a frequency acquisition loop (comprising frequency acquisition circuitry 13 and VCO 20) which is shared by all four of the layers of FIG. 3(a). Each of the four layers of FIG. 3(a) also comprises two loops: a data loop (including one set of circuits 4, 6, 8, and 10, one layer of charge pump circuitry 12, and one layer of VCO 20), and a dead zone width control loop (including circuit 14 and one set of circuits 4, 6, 8, and 10).

Circuits 12, 14, 15, and 19 are clock control circuitry in the sense that they control generation of clocks by VCO 20 and dead zone generation circuit 10. Other embodiments of the invention include other implementations of clock control circuitry.

After power-on, the frequency acquisition loop is initially activated to set the CDR operation frequency within the range of ±200 ppm apart from the frequency of an external reference clock ("Ref_CLK"). After frequency lock is obtained, the frequency acquisition loop is deactivated and the data loops and dead zone width control loops are activated.

Each data loop provides a data sampling clock (idCLK[0], idCLK[1], idCLK[2], or idCLK[3]) and an edge sampling clock (ixCLK[0], ixCLK[1], ixCLK[2], or ixCLK[3]) to a different one of the four circuits 10 of AES phase detector 2, and each circuit 10 generates an adjusted data sampling clock (dCLK[0], dCLK[1], dCLK[2], or dCLK[3]) in response to the data sampling clock that it receives (and in response to control signals generated by one of finite state machines 4) and generates an adjusted edge sampling clock (xCLK[0], xCLK[1], xCLK[2], or xCLK[3]) in response to the edge sampling clock that it receives (and in response to control signals generated by one of finite state machines 4). Each sampling circuit 8 uses the adjusted data sampling clock that it receives to produce a stream of data samples (DS[0], DS[1], DS[2], or DS[3]) in response to the differential input signal, RDP, RDN. Each data loop adjusts the phase of the data sampling clock that it generates to the center of the data eye and keeps the edge sampling clock that it generates 180 degrees out of phase with the corresponding data sampling clock.

The dead zone width control loop adjusts the edge sampling clocks (ixCLK[0], ixCLK[1], ixCLK[2], and ixCLK[3]) in response to a set of dead zone width control bits ("ctr[2:0]") generated by dead zone width control circuit 14, to track the boundary of the data eye. Circuit 14 preferably generates the dead zone width control bits as follows. Circuit 14 receives a sequence of bits $up_i$ (a sequence of bits $up_1$, $up_2$, $up_3$, or $up_4$ from one layer of AES PD 2), and a sequence of bits $down_i$ (a sequence of bits $down_1$, $down_2$, $down_3$, or $down_4$ from the same layer of AES PD 2). Each bit $up_i$ is a bit of a word up[0:3] generated by AES PD 2, and each bit $down_i$ is a bit of a word down[0:3] generated by AES PD 2. Circuit 14 also receives a sequence of bits $v_i$ (a sequence of bits $v_1$, $v_2$, $v_3$, or $V_4$ from one layer of AES PD 2), where each bit $v_i$ is a bit of a word v[0:3] from AES PD 2 that indicates whether there has been a transition (during the last two cycles of clock dCLK) of the input data signal RDP, RDN received by the relevant layer. Circuit 14 counts (in the digital domain, and for any one index value "i") the number of "$up_i$" and "$down_i$" bits that satisfy "$up_i$"=1 or "$down_i$"=1 and that occur during a predetermined number of valid data transitions (as indicated by the bits $v_i$ of a sequence of the words v[0:3], for any one index value "i"), in a manner to be described with reference to FIGS. 12(a) and 12(b). To prevent the interaction between each data loop and the corresponding dead zone width control loop, the bandwidth of the dead zone width control loop is much smaller than that of the data loop.

VCO 20 asserts four raw edge sampling clock signals ixCLK[0:3] (one for each layer) to AES PD 2 and one of the raw edge sampling clock signals (ixCLK[0], ixCLK[1], ixCLK[2], or ixCLK[3]) to frequency acquisition circuitry 13, and also asserts four raw data sampling signals idCLK[0:3] (one for each layer) to AES PD 2. Frequency acquisition circuitry 13 includes frequency divider 17, phase detector and charge pump circuit 18, and frequency lock detection circuit 16, connected as shown. To obtain frequency lock with external reference clock "Ref_CLK," lock detection circuit 16 asserts to switch 19 a control signal (indicating that frequency lock has not yet been obtained) to cause switch 19 to feed back control voltages from circuit 18 (which are low pass filtered by filter 15) to VCO 20. When the PLL implemented by elements 17, 18, 15, and 20 has caused VCO 20 to lock the signals ixCLK[0:3] and idCLK[0:3] to the reference clock, lock detection circuit 16 asserts to switch 19 a control signal (indicating that frequency lock has been obtained) causing switch 19 to connect the outputs of charge pump circuitry 12 to VCO 20.

Figure 13:
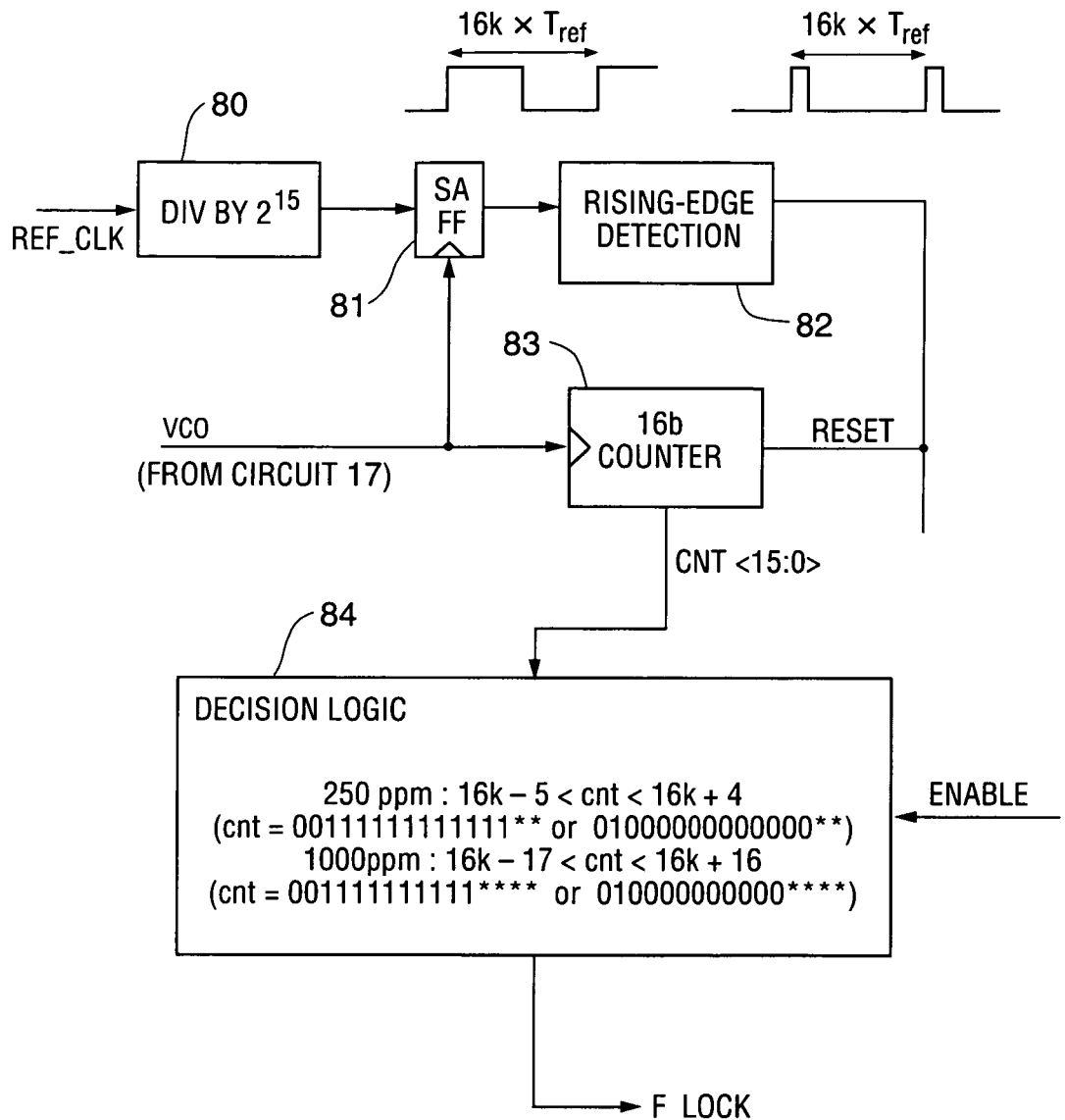
FIG. 13 is a block diagram of a frequency lock detector that can be used to implement the frequency lock detector block of FIG. 3(a).

FIG. 13 is a block diagram of a frequency lock detector that can be used to implement lock detection circuit 16 of FIG. 3(a). A reference time interval (16k×$T_{ref}$), where 1/$T_{ref}$ is the frequency of the external reference clock Ref_CLK) is generated from frequency divider block 80 of the FIG. 13 circuit. The "VCO" signal asserted to sense-amp type flip-flop (SAFF) 81 and sixteen-bit counter 83 is a divided-down version (asserted by divider 17 of FIG. 3(a)) of one of the signals ixCLK output by VCO 20. Because the VCO and Ref_CLK signals comprise an asynchronous clock boundary, sense-amp type flip-flop (SAFF 81) is used to avoid a metastable situation. By using frequency divider 80 and SAFF 81, the frequency lock detector of FIG. 13 has less hardware complexity than does the frequency lock detection circuitry disclosed in the above-cited paper by Y. Moon, et al. The FIG. 13 detector also includes rising edge detection circuit 82, 16-bit counter 83, and decision logic 84, connected as shown. Decision logic 84 of FIG. 13 applies two different thresholds for getting into (250 ppm) or leaving (1000 ppm) the lock state for robust operation. The control signal "F lock" output from logic 84 is asserted to switch 19.

As noted, charge pump circuitry 12 of FIG. 3(a) preferably includes four identical charge pump circuits. Each charge pump circuit is for sourcing or sinking a current $I_P$ to or from the capacitors of low pass filter 15. All the charge pump circuits drive a single low pass filter 15. The voltage across the capacitors of filter 15 is asserted to VCO 20 to control clock signal generation by VCO 20. Each of the four charge pump circuits is preferably implemented as shown in FIG. 11(c). Node N of FIG. 11(c) can be coupled (via switch 19) to Node M of filter 15. When node N of FIG. 11(c) is coupled to Node M of filter 15, the capacitors of filter 15 are charged (or discharged) in response to the current $I_P$ that is sourced to (or sunk from) the capacitors by the FIG. 11(c) circuit. When switch 19 couples the relevant charge pump circuit (within circuitry 12) to VCO 20 and filter 15, filter 15 low-pass filters the voltage $V_C$ across the capacitors (the voltage at node M of filter 15), and the low-pass-filtered voltage $V_C$ is asserted to VCO 20.

The FIG. 11(c) circuit is coupled to receive a pair of charge pump control bits "$up_i$" and "$down_i$" from circuit 2a, 2b, 2c, or 2d (of AES PD 2) and to receive a pair of bias potentials $V_p$ and $V_n$. The bit "$up_i$" is denoted as "up" in FIG. 11(c). The FIG. 11(c) circuit generates the complement (denoted as "downb" in FIG. 11(c)) of the bit "$down_i$". In response to up$_i$=1 and down$_i$=0 (when the FIG. 11(c) circuit is coupled to filter 15), as can occur when the raw data clock idCLK lags the input data, the FIG. 11(c) circuit asserts a positive current I$_p$ to the capacitors of filter 15, to charge these capacitors. In response to the bits up$_i$=0 and down$_i$=1 (when the FIG. 11(c) circuit is coupled to filter 15), as can occur when the raw data clock idCLK leads the input data, the FIG. 11(c) circuit sinks the current I$_p$ from the capacitors of filter 15, to discharge these capacitors. In response to the bits up$_i$=0 and down$_i$=0 (when the FIG. 11(c) circuit is coupled to filter 15), as can occur when the raw data clock idCLK is locked with the input data, no significant current flows to or from the capacitors of filter 15.

Still with reference to FIG. 11(c), bias potentials V$_p$ and V$_n$ determine the absolute value of the current I$_P$ as follows, when PMOS transistor P1 of FIG. 11(c) is implemented as a multi-finger transistor having multiple channels and multiple gates. The channels are connected in parallel between nodes A and N of FIG. 11(c). Switches (not shown in FIG. 11(c)) are coupled between the gates and the circuitry (not shown) providing the potential V$_p$, so that by closing each of the switches the gate coupled thereto is held at potential V$_p$. The switches are controlled by dead zone width control bits ctr[2:0] received from dead zone width control circuit 14. When circuit 14 increases the ctr[2:0] value (to widen the dead zone in response to high jitter), more of the switches close, thus causing current to flow through more of the channels of the multi-finger transistor, and thereby increasing the absolute magnitude of I$_P$. When circuit 14 decreases the ctr[2:0] value (to narrow the dead zone in response to low jitter), more of the switches open, thus causing current to flow through fewer of the channels of the multi-finger transistor, and thereby decreasing the absolute magnitude of I$_P$. For example, in one implementation in which transistor P1 has eight channels, current flows through only one of the channels of transistor P1 when ctr[2:0]=000, and current flows through all of the channels of transistor P1 when ctr[2:0]=111.

When NMOS transistor N1 of FIG. 11(c) is implemented as a multi-finger transistor having multiple gates and multiple channels, the channels of transistor N1 are connected in parallel between nodes N and B of FIG. 11(c). Switches (not shown in FIG. 11(c)) are coupled between the gates and the circuitry (not shown) providing the potential V$_n$, so that by closing each of the switches the gate coupled thereto is held at potential V$_n$. The switches are controlled by dead zone width control bits ctr[2:0] received from dead zone width control circuit 14. When circuit 14 increases the ctr[2:0] value (to widen the dead zone in response to high jitter), more of the switches close, thus causing current to flow through more of the channels of the multi-finger transistor, and thereby increasing the absolute magnitude of I$_P$. When circuit 14 decreases the ctr[2:0] value (to narrow the dead zone in response to low jitter), more of the switches open, thus causing current to flow through fewer of the channels of the multi-finger transistor, and thereby decreasing the absolute magnitude of I$_P$. For example, in one implementation in which transistor N1 has eight channels, current flows through only one of the channels of transistor N1 when ctr[2:0]=000, and current flows through all of the channels of transistor N1 when ctr[2:0]=111.

Preferably, multi-finger transistors P1 and N1, the switches (not shown) coupled to the gates of each of transistors P1 and N1, and the rest of the FIG. 11(c) operate to cause the absolute value of I$_P$ to be proportional to the jitter, thereby causing the average pumping current (I$_{avg}$) sourced (or sunk) by circuitry 12 (over each time interval in which averaged phase error, between the raw data clock idCLK and the data, is positive or negative), and data loop gain (K$_{PD}$), to be at least substantially independent of jitter and dead zone width (e.g., as shown in the bottom graph of FIG. 1(b), in which charge pump current (I$_P$) is varied to be proportional to dead zone width W$_D$ to keep the data loop gain (K$_{PD}$) independent of jitter and dead zone width).

Figure 11A:
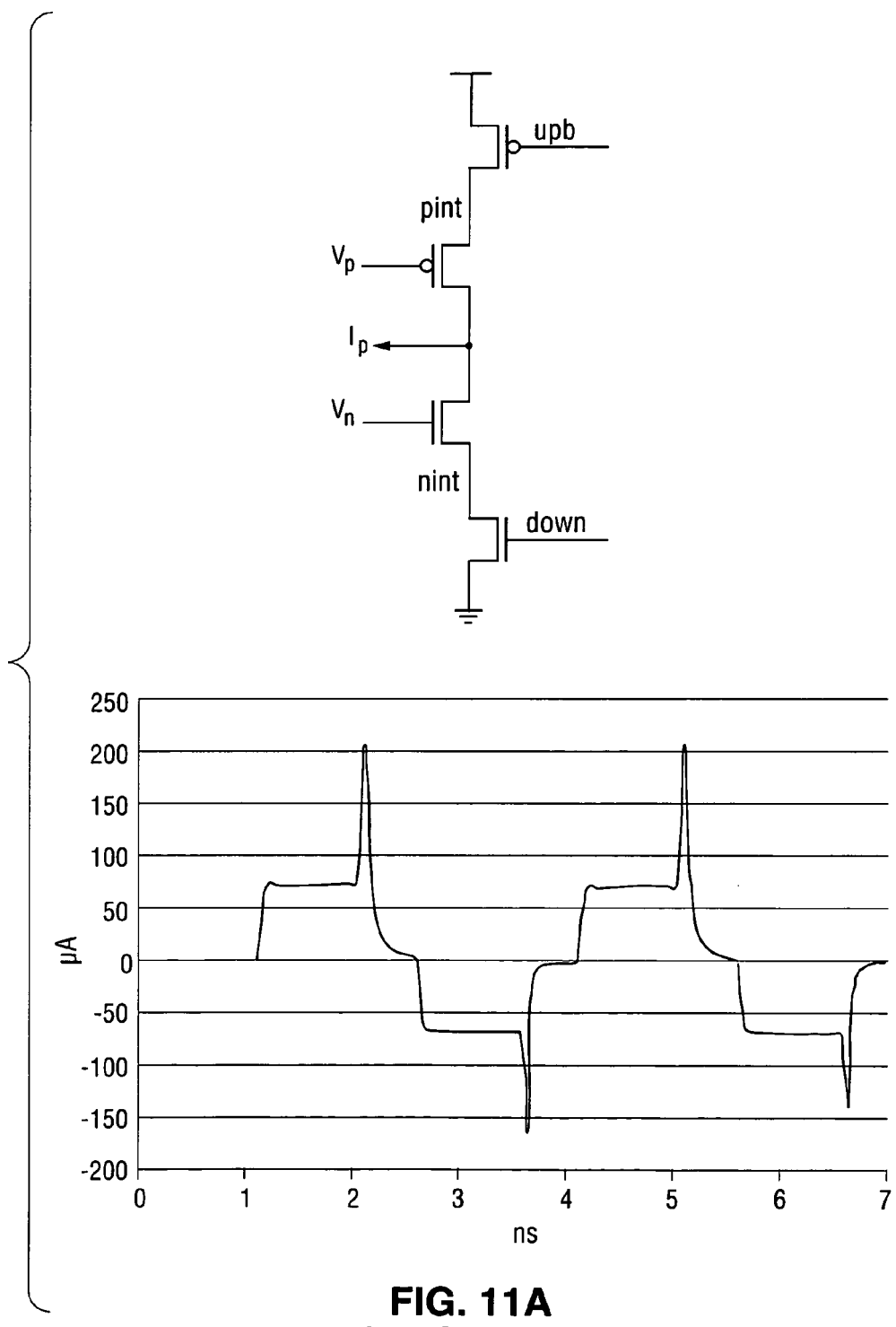
FIG. 11(a) is a schematic diagram of a conventional charge pump, and a waveform indicating the charge pump current $I_p$ that would be generated by each charge pump of charge pump circuitry 12 of FIG. 3(a), in response to a specific sequence of $up_i$ and $down_i$ bits, if such charge pump were implemented as the conventional charge pump of FIG. 11(a).
Figure 11B:
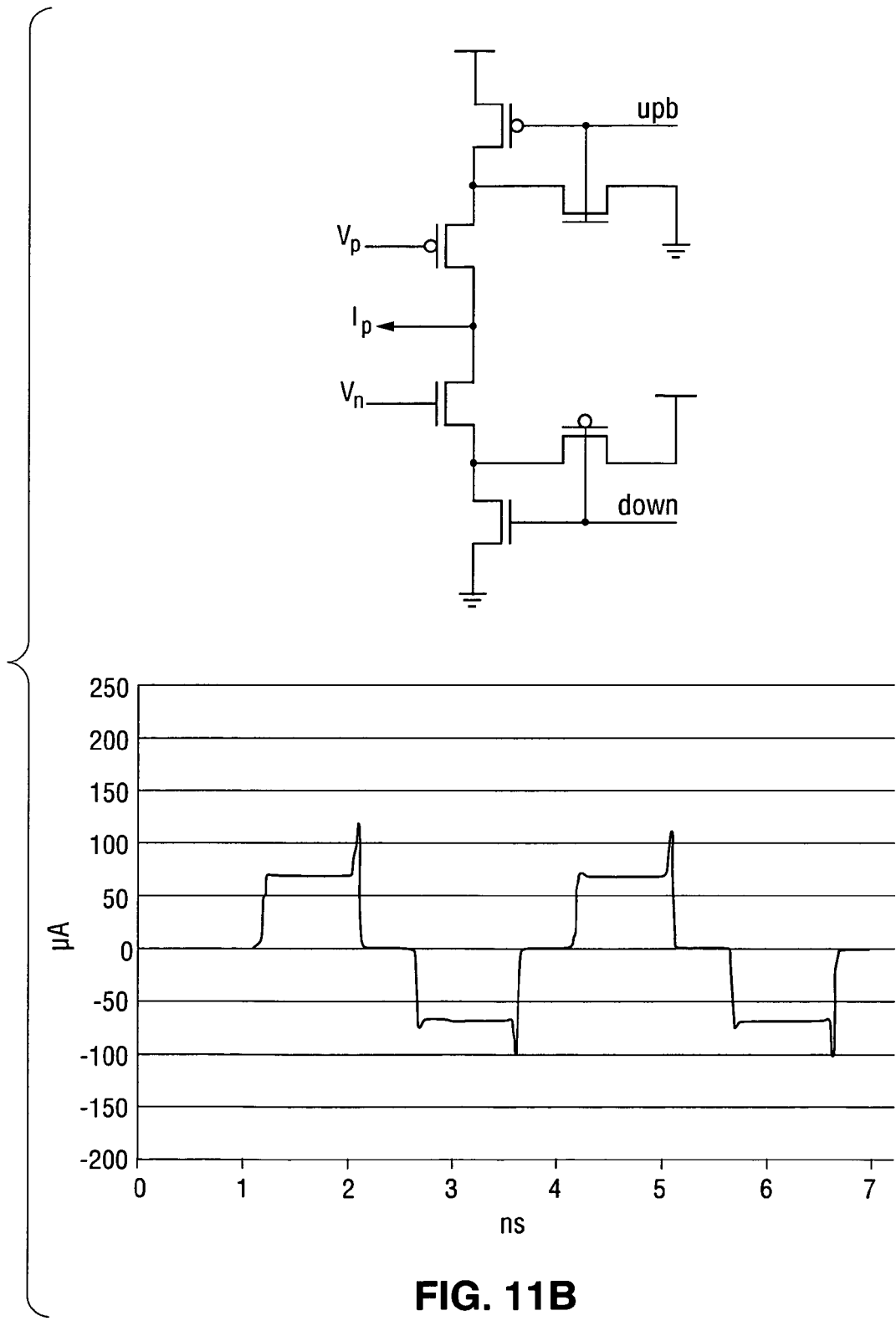
FIG. 11(b) is a schematic diagram of a conventional charge pump, and a waveform indicating the charge pump current $I_p$ that would be generated by each charge pump of charge pump circuitry 12 of FIG. 3(a), in response to a specific sequence of $up_i$ and $down_i$ bits, if such charge pump were implemented as the conventional charge pump of FIG. 11(b).
Figure 11C:
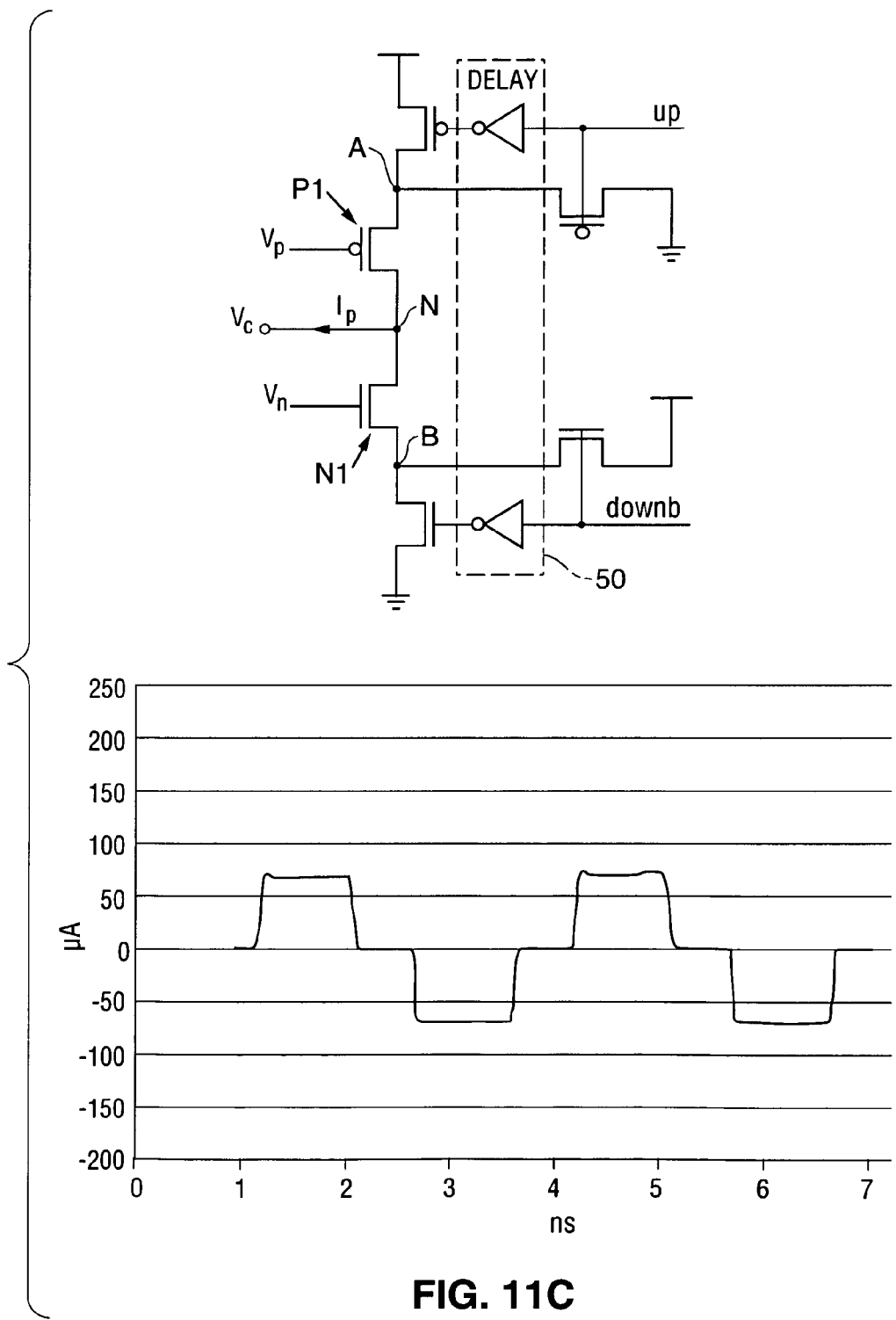
FIG. 11(c) is a schematic diagram of a charge pump designed in accordance with the present invention, and a waveform indicating the charge pump current $I_p$ that would be generated by each charge pump of charge pump circuitry 12 of FIG. 3(a), in response to a specific sequence of $up_i$ and $down_i$ bits, if such charge pump were implemented as shown in FIG. 11(c).

An important advantage of implementing charge pump circuitry 12 to include charge pump of FIG. 11(c) can be appreciated by comparing FIGS. 11(a), 11(b), and 11(c). This advantage is the elimination or reduction of a charge sharing problem that occurs in many charge pumps (e.g., in the conventional charge pump shown in FIG. 11(a)). The parasitic capacitance at the pint and nint nodes in FIG. 11(a) causes charge sharing, and can cause peak current to flow (to a capacitor being charged/discharged by the FIG. 11(a) circuit) if charge pump circuitry 12 of FIG. 3(a) is implemented to include the charge pump shown in FIG. 11(a). The simulation result shown in FIG. 11(a), which assumes that charge pump circuitry 12 is implemented to include the charge pump circuit of FIG. 11(a), shows about 300% of peak current flow in response to rapidly changing values of charge pump control bits "upb" and "down." This peak current can undesirably cause a larger jitter and systematic phase offset in the PLL.

To overcome this problem, a charge pump with a charge removal transistor has been proposed in P. Larsson, "A 2-1600-MHz CMOS Clock Recovery PLL with Low-Vdd Capability," J. Solid-State Circuits, vol. 34, pp. 1951-1960, December 1999. A charge pump having the Larsson design is shown in FIG. 11(b). Even using charge pumps having the Larsson design in charge pump circuitry 12 of FIG. 3(a), there still would be about 50% peak current flow (as shown in the simulation result of FIG. 11(b), which assumes that charge pump circuitry 12 is implemented to include the charge pump circuit of FIG. 11(b)) in response to rapidly changing values of charge pump control bits "upb" and "down."

In accordance with the present invention, such peak current flow is eliminated completely by inserting a delay element in the up/down signal path of each charge pump circuit of the inventive CDR. FIG. 11(c) is a schematic diagram of a charge pump circuit including such a delay element (identified by reference numeral 50), and a graph (a simulation result) of the charge pump current generated by this charge pump in response to rapidly changing values of the charge pump control bits "up" and "downb" of FIG. 11(c). The simulation result of FIG. 11(c) shows that no peak current would flow to the capacitance being charged/discharged by the FIG. 11(c) circuit if each charge pump circuit of charge pump circuitry 12 were implemented as shown in FIG. 11(c).

Figure 3C:
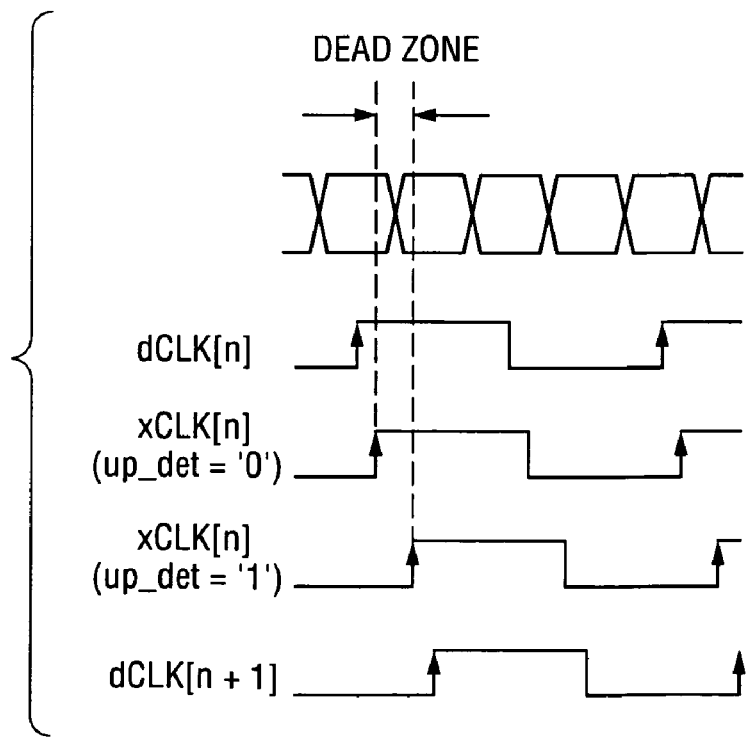
FIG. 3(c) is a timing diagram of signals asserted during operation of the FIG. 3(a) circuit, showing clock positions for states of circuit 2a, 2b, 2c, or 2d.
Figure 4A:
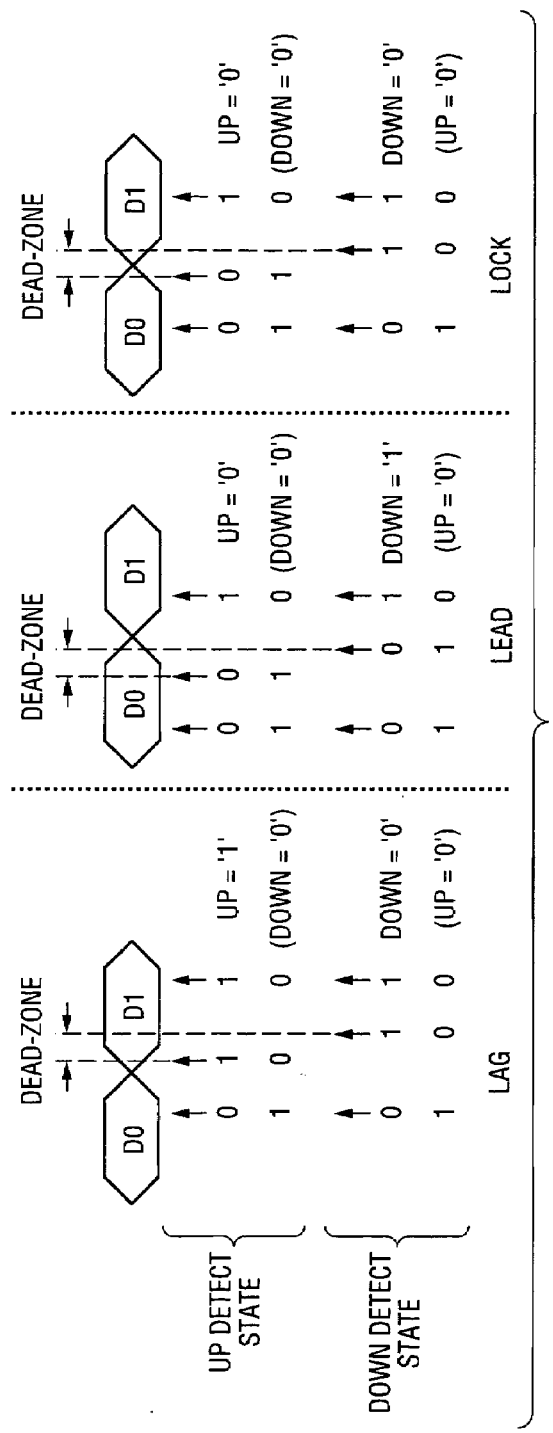
FIG. 4(a) is a timing diagram of signals asserted during operation of the FIG. 3(a) circuit.

AES PD 2 realizes the dead zone using 2× oversampling clocks. In contrast with a conventional 2× oversampling PD, each edge sampling clock xCLK produced by AES PD 2 samples data with some offset from the data transition edge. By alternating the polarity of the offset, the dead zone is established. Each of circuits 2a, 2b, 2c, and 2d of AES PD 2 has two phase detection states, referred to as the UP state and the DOWN state, and the state of each circuit 2a, 2b, 2c, and 2d determines the polarity of sampling offset. FIG. 3(c) shows clock positions for each state of circuit 2a, 2b, 2c, or 2d. As shown in FIG. 3(c), in the UP state, the edge sampling clock (xCLK) samples the data at the left side of the data transition edge (as shown in FIGS. 1(b) and 4(a)), assuming the sampling clocks are locked to the data. If the "edge" data sample (the data sample most recently generated using the edge sampling clock of the relevant one of circuits 2a, 2b, 2c, and 2d) does not match the most recently generated "center" data sample (where each "center" data sample is generated using one of the data sampling clocks dCLK), the up signal is asserted with a "one" value (up=1) and the PD remains in the UP state (i.e., up_det remains equal to 1). If no transition edge is detected using such edge sampling clock (i.e., if the most recently generated "edge" data sample matches the most recently generated "center" data sample), the up signal is asserted with a "zero" value and the PD undergoes a transition to the DOWN state (i.e., up_det=0 is asserted).

As also apparent from FIG. 3(c) and the description below of FIGS. 4(a) and 4(b), in the DOWN state, the edge sampling clock (xCLK) samples the data at the right side of the data transition edge (as shown in FIGS. 1(b) and 4(a)), assuming the sampling clocks are locked to the data. If the "edge" data sample (the data sample most recently generated using the edge sampling clock of the relevant one of circuits 2a, 2b, 2c, and 2d) matches the next generated "center" data sample, the down signal is asserted with a "one" value (down=1) and the PD remains in the DOWN state (i.e., up_det remains equal to 0). If a transition edge is detected using such edge sampling clock (i.e., if the most recently generated "edge" data sample does not match the next generated "center" data sample), the down signal is asserted with a "zero" value and the PD undergoes a transition to the UP state (i.e., up_det=1 is asserted).

Figure 3B:
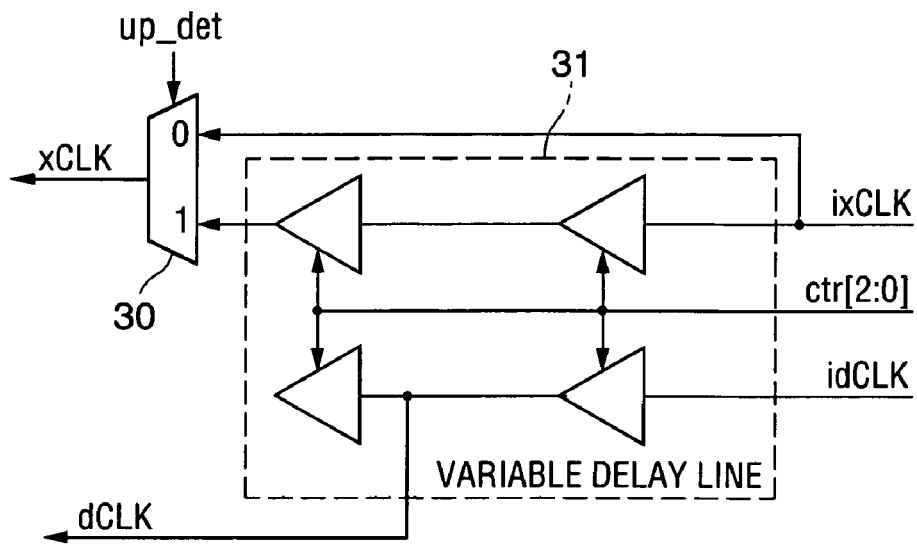
FIG. 3(b) is a block diagram of a dead zone generator for use in the FIG. 3(a) circuit.

FIG. 3(b) is a block diagram of an implementation of dead zone generator 10 of the FIG. 3(a) circuit. The dead zone generator of FIG. 3(b) generates the variable offsets of the edge sampling clock xCLK. It modulates the raw edge sampling clock ixCLK according to the PD state (which is determined by the control bit up_det) and in response to dead zone width control bits (ctr[2:0]) from dead zone width control circuit 14. A variable delay line (VDL 31) is used to establish the dead zone. By delaying the raw data sampling clock (idCLK) by half the length (half the total delay) of the VDL (to generate the data sampling clock dCLK), the edge sampling clock xCLK output from (asserted at the output of multiplexer 30 of) the FIG. 3(b) circuit in response to the raw edge sampling clock ixCLK can have a positive or negative offset relative to the data transition edge when the CDR is locked. VDL 31's total delay is determined by the dead zone width control bits (ctr[2:0]), which are generated in a manner described with reference to FIG. 12(a). In response to increasing values of ctr[2:0], the width of the dead zone is increased. In response to decreasing values of ctr[2:0], the width of the dead zone is decreased.

FIG. 4(a) shows the behavior of each of circuits 2a, 2b, 2c, and 2d of FIG. 3(a) in some representative cases. In contrast with the conventional binary PD, the inventive AES PD detects only one side of the phase error. In the UP state, the edge sampling clock xCLK (one of xCLK[0], xCLK[1], xCLK[2], and xCLK[3]) samples data at the left boundary of the dead zone and the AES PD makes a decision as to whether the VCO phase should be increased or not, while the down signal is kept low. In the UP state (i.e., if up_det=1), if an transition edge is detected using the edge sampling clock, the up signal is asserted (up=1) and the AES PD remains in the UP state. If no transition edge is detected using the edge sampling clock, the up signal is not asserted (up=0) and the AES PD undergoes a transition to the DOWN state but the data loop does not change the raw edge sampling clock ixCLK or the raw data sampling clock idCLK.

On the contrary, the up signal is always zero in DOWN state. In the DOWN state, the edge sampling clock xCLK samples data at the right boundary of the dead zone and the AES PD makes a decision as to whether the VCO phase should be decreased or not. In the DOWN state (i.e., if up_det=0), if no transition edge is detected using the edge sampling clock, the down signal is asserted (down=1) and the AES PD remains in the DOWN state. If a transition edge is detected using the edge sampling clock, the down signal is not asserted (down=0) and the AES PD undergoes a transition to the UP state but the data loop does not change the raw edge sampling clock ixCLK or the raw data sampling clock idCLK.

More specifically, a preferred embodiment of finite state machine (FSM) 4 of each of circuits 2a, 2b, 2c, and 2d of FIG. 3(a) makes a decision as to whether to assert an up signal (up[i], for i=0, 1, 2, or 3) or a down signal (down[i], for i=0, 1, 2, or 3) by comparing three data samples:

a first sample (to be denoted as a "P" sample, where "P" denotes previous or recent) of the data generated at an edge of the data sampling clock dCLK[n];

a second sample (to be denoted as an "N" sample, where "N" denotes next) of the data generated at the next edge of the data sampling clock dCLK[n+1], for n=0, 1, or 2 (in the case that n=3, the "N" sample is generated at the next edge of data sampling clock dCLK [0]); and a third sample (to be denoted as an "E" sample, where "E" denotes edge) of the data generated at an edge of the edge sampling clock xCLK[n], said edge occurring between the edges of the data sampling clocks at which the "P" and "N" samples are generated (e.g., between the edges of dCLK[n] and dCLK[n+1], when n=0, 1, or 2).

FSM 4 of each of circuits 2a, 2b, 2c, and 2d of FIG. 3(a) preferably shares data samples with FSM 4 of another one of circuits 2a, 2b, 2c, and 2d, as follows. FSM 4 of circuit 2b employs the current "N" sample of circuit 2a as its "P" sample, FSM 4 of circuit 2c employs the current "N" sample of circuit 2b as its "P" sample, and so on.

In the UP state, each FSM 4 compares the P and E samples. If P=E, neither the up signal nor the down signal is asserted (up=0 and down=0), and the state is switched to the DOWN state. In the UP state, if P does not equal E, the up signal is asserted (up=1 and down=0), and the relevant one of circuits 2a, 2b, 2c, and 2d remains in the UP state.

In the DOWN state, each FSM 4 compares the N and E samples. If N=E, neither the up signal nor the down signal is asserted (up=0 and down=0), and the state is switched to the UP state. In the DOWN state, if N does not equal E, the down signal is asserted (up=0 and down=1), and the relevant one of circuits 2a, 2b, 2c, and 2d remains in the DOWN state.

Figure 4B:
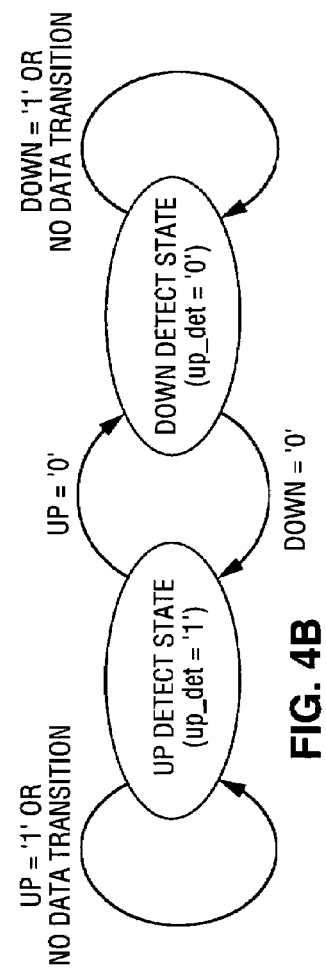
FIG. 4(b) is a state diagram of the FIG. 3(a) circuit.

FIG. 4(b) is a state transition diagram of each of circuits 2a, 2b, 2c, and 2d of FIG. 3(a). The next state of each circuit depends on a current state and a phase detection result (e.g., assertion of up=1 when up_det=1 in the UP state, or assertion of down=1 when up_det=0 in the DOWN state). If an up=1 signal is detected in the UP state, the AES PD decides to stay in the UP state, and FSM 4 asserts up_det=1. If a down=1 signal is detected in the DOWN state, the AES PD decides to stay in the DOWN state, and finite state machine 4 asserts up_det=0. The AES PD stays in the UP state until it fails to detect the up signal (i.e., until finite state machine 4 detects up=0). The AES PD stays in the DOWN state until it fails to detect the down signal (i.e., until finite state machine 4 detects down=0). Once the AES PD, in the UP (DOWN) state, fails to detect the up (down) signal, it changes its state to DOWN (UP) state in the next cycle. As a result, when the VCO clocks lag the input data, the AES PD mainly stays in the UP state, and when the VCO clocks lead the input data, the AES PD mainly stays in the DOWN state. Hence the AES PD can have a comparable phase acquisition speed with the conventional binary PD. When the CDR is locked to the input data, AES PD alternates its state at every data transition.

Figure 12A:
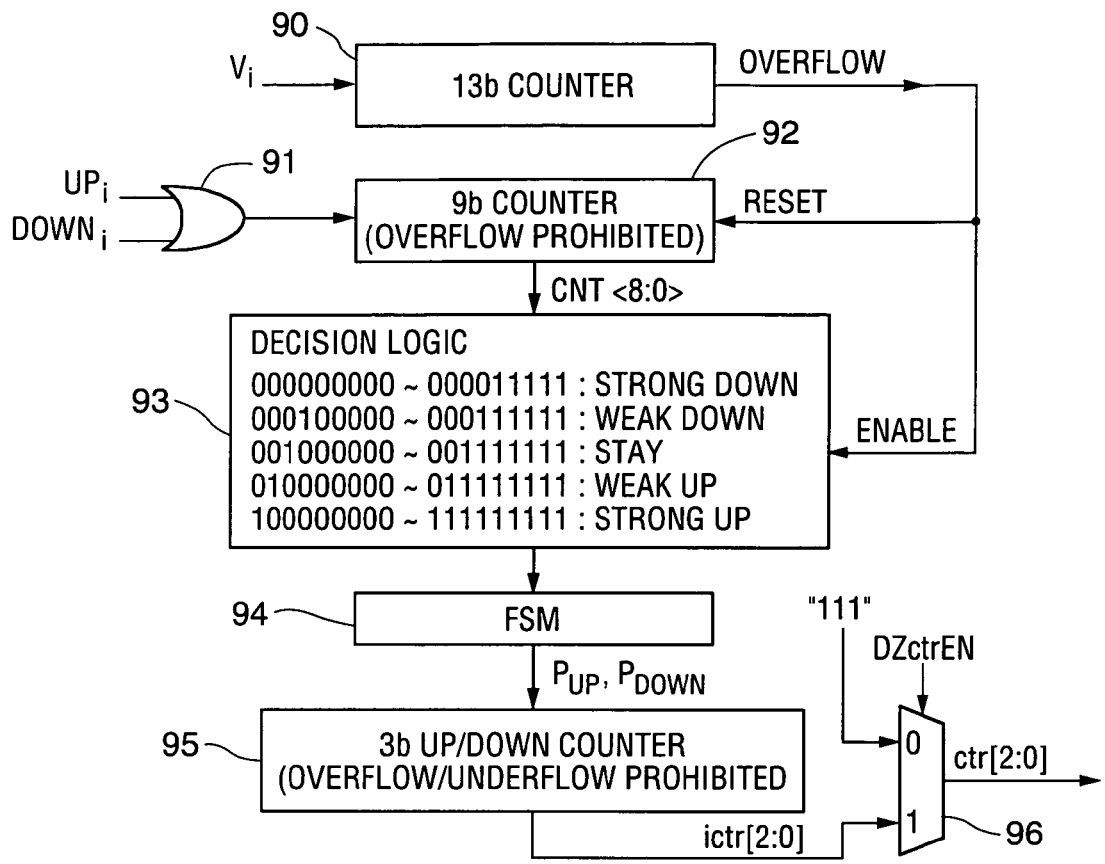
FIG. 12(a) is a block diagram of a dead zone width control loop that can be used to implement the dead zone width control loop of FIG. 3(a).

FIG. 12(a) is a block diagram of a dead zone width control loop that can be used to implement the dead zone width control loop of FIG. 3(a), with the bit "$v_i$" in FIG. 12(a)

denoting one of the valid data transition bits v[0:3] of FIG. 3(a). Dead zone width control circuit 14 of FIG. 3(a) can be implemented as the FIG. 12(a) circuit, to generate a set of dead zone width control bits ("ctr[2:0]") for use by circuits 10 (of AES PD 2) in generating the edge sampling clock signals xCLK.

As noted, circuit 14 receives from AES PD 2 a sequence of bits $up_i$ (from one of the layers of AES PD 2), a sequence of bits $down_i$ of the above-mentioned type (from the same layer of AES PD 2), and a sequence of bits $v_i$ (from the same layer of AES PD 2), each bit $v_i$ indicating whether there has been a transition (during the last two cycles of clock dCLK) of the input data signal RDP, RDN.

The circuit of FIG. 12(a) counts (in the digital domain) the number of "$up_i$" and "$down_i$" bits (received at the inputs of OR gate 91) that satisfy "$up_i$"=1 or "$down_i$"=1 and that occur during a predetermined number, X, of valid data transitions (as indicated by X occurrences of $v_i$=1 in the received sequence of bits $v_i$). The dead zone width control loop of the FIG. 3(a) system keeps the occurrence rate of $up_i$=1 or $down_i$=1 bits in a specific range (e.g., $\frac{1}{16} \geq Y/X \geq \frac{1}{64}$, where Y is the number of occurrences of $up_i$=1 or $down_i$=1 per X occurrences of $v_i$=1 in a preferred embodiment) by counting the number of data transitions (each indicated by of $v_i$=1) and the number of $up_i$=1 or $down_i$=1 bits.

Counter 90 of FIG. 12(a) counts valid data transitions by counting occurrences of $v_i$=1. During $2^{13}$ data transitions, occurrences of $up_i$=1 or $down_i$=1 are accumulated by counter 92, and the result is fed from counter 92 to decision logic 93. Logic 93 asserts one of five code words in response at the end of each cycle of $2^{13}$ data transitions: a "strong down" code word indicating a very small number of occurrences of $up_i$=1 or $down_i$=1 (e.g., from 000000000 to 000011111 occurrences) during the cycle; a "weak down" code word indicating a greater number of occurrences of $up_i$=1 or $down_i$=1 (e.g., from 000100000 to 000111111 occurrences) during the cycle; a "stay" code word indicating a greater number of occurrences of $up_i$=1 or $down_i$=1 (e.g., from 001000000 to 001111111 occurrences) during the cycle; a "weak up" code word indicating a greater number of occurrences of $up_i$=1 or $down_i$=1 (e.g., from 010000000 to 011111111 occurrences) during the cycle; and a "strong up" code word indicating a greater number of occurrences of $up_i$=1 or $down_i$=1 (e.g., from 100000000 to 111111111 occurrences) during the cycle.

Figure 12B:
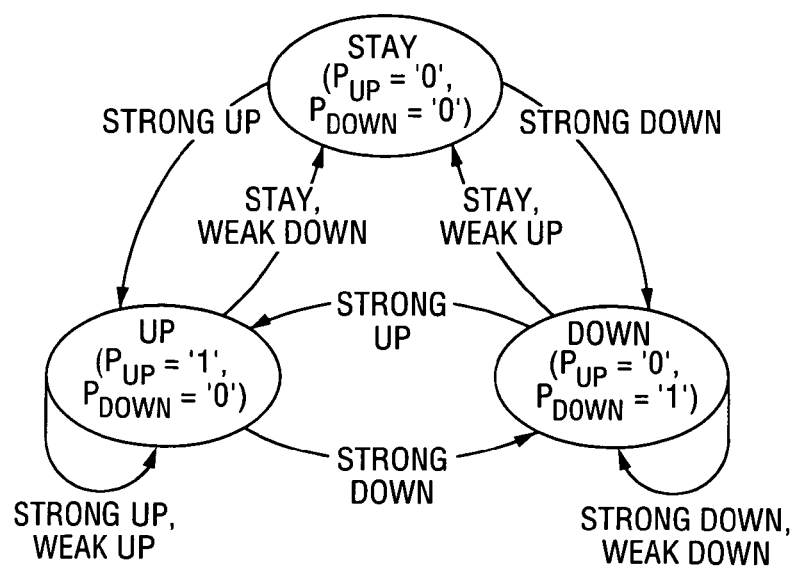
FIG. 12(b) is the state diagram of the FSM of FIG. 12(a).

The output of logic 93 is asserted to finite state machine (FSM) 94. FSM 94 includes logic that generates dead zone width control signals ($P_{UP}$, $P_{DOWN}$) and implements a hysteresis in generating the dead zone width control signals to stabilize the loop as indicated in the state transition diagram of FIG. 12(b). FIG. 12(b) is a state transition diagram of FSM block 94 of FIG. 12(a). As indicated in FIG. 12(b), FSM 94 is in a "STAY" state in which it asserts bits $P_{UP}$ and $P_{DOWN}$ with the values $P_{UP}$=0, $P_{DOWN}$=0, unless and until it receives a "strong up" or "strong down" code word. In response to a "strong up" code word, it enters an "UP" state in which it asserts bits Pup and $P_{DOWN}$ with the values $P_{UP}$=1, $P_{DOWN}$=0. In response to a "strong down" code word, it enters a "DOWN" state in which it asserts bits $P_{UP}$ and $P_{DOWN}$ with the values $P_{UP}$=0, $P_{DOWN}$=1.

In the "UP" state, FSM 94 enters the DOWN state in response to a "strong down" code word, enters the STAY state in response to a "stay" or "weak down" code word, and otherwise remains in the UP state. In the "DOWN" state, FSM 94 enters the UP state in response to a "strong up" code word, enters the STAY state in response to a "stay" or "weak up" code word, and otherwise remains in the DOWN state.

Preferably, counter 95 initially asserts a dead zone width control word ictr[2:0] (to one input of multiplexer 96) with the value ictr[2:0]=100. In response to $P_{UP}$=1, $P_{DOWN}$=0, counter 95 increments by one the word ictr[2:0] that it asserts to multiplexer 96. In response to $P_{UP}$=0, $P_{DOWN}$=1, counter 95 decrements by one the dead zone width control word ictr[2:0] that it asserts to multiplexer 96. In response to $P_{UP}$=0, $P_{DOWN}$=0, counter 95 neither increments nor decrements the dead zone width control word ictr[2:0] that it asserts to multiplexer 96.

The default control word "111" is asserted to the other input of multiplexer 96. The control signal DzctrEN asserted to multiplexer 96 determines whether multiplexer 96 asserts the current dead zone width control word ictr[2:0], or the default control word, as the current dead zone width control word ctr[2:0]. The control signal DzctrEN is generated from the frequency lock signal produced by lock detection circuit 16, so that the dead zone width control loop is activated only after a frequency lock is achieved.

Circuits 90, 92, and 93 of FIG. 12(a) comprise a jitter estimating circuit. The strong down" code word that it generates indicates a small amount of jitter in the input data, the "weak down" code word indicates a greater amount of jitter, the "stay" code word indicates a greater amount of jitter, the "weak up" code word indicates a greater amount of jitter, and the "strong up" code word indicates a still greater amount of jitter. In response to each jitter signal generated by circuitry 14, the dead zone width control loop adjusts the width ($W_D$) of the dead zone determined by one of the edge sampling clocks xCLK (as described with reference to FIG. 3(b)), and preferably also controls the absolute magnitude of the charge pump current ($I_P$) sourced or sunk by charge pump circuitry 12 (as described with reference to FIG. 11(c)). The dead zone width ($W_D$) is automatically adjusted during operation (in response to the jitter signal, with hysteresis as implemented by finite state machine 94) to cause the edges of the dead zone to track the boundaries of the data eye, for example as indicated in FIG. 1(b). In FIG. 1(b), the data sampling clock dCLK has phase error $\phi_A$ (relative to the center of the data eye), two versions of the edge sampling clock xCLK are shown (an "up" version having phase ($\phi$−180+$W_D$/2) degrees, and a "down" version having phase ($\phi$−180−$W_D$/2) degrees, where $\phi$ is the phase of dCLK), and the dead zone width $W_D$ is varied to be proportional to the data's jitter.

Figure 5:
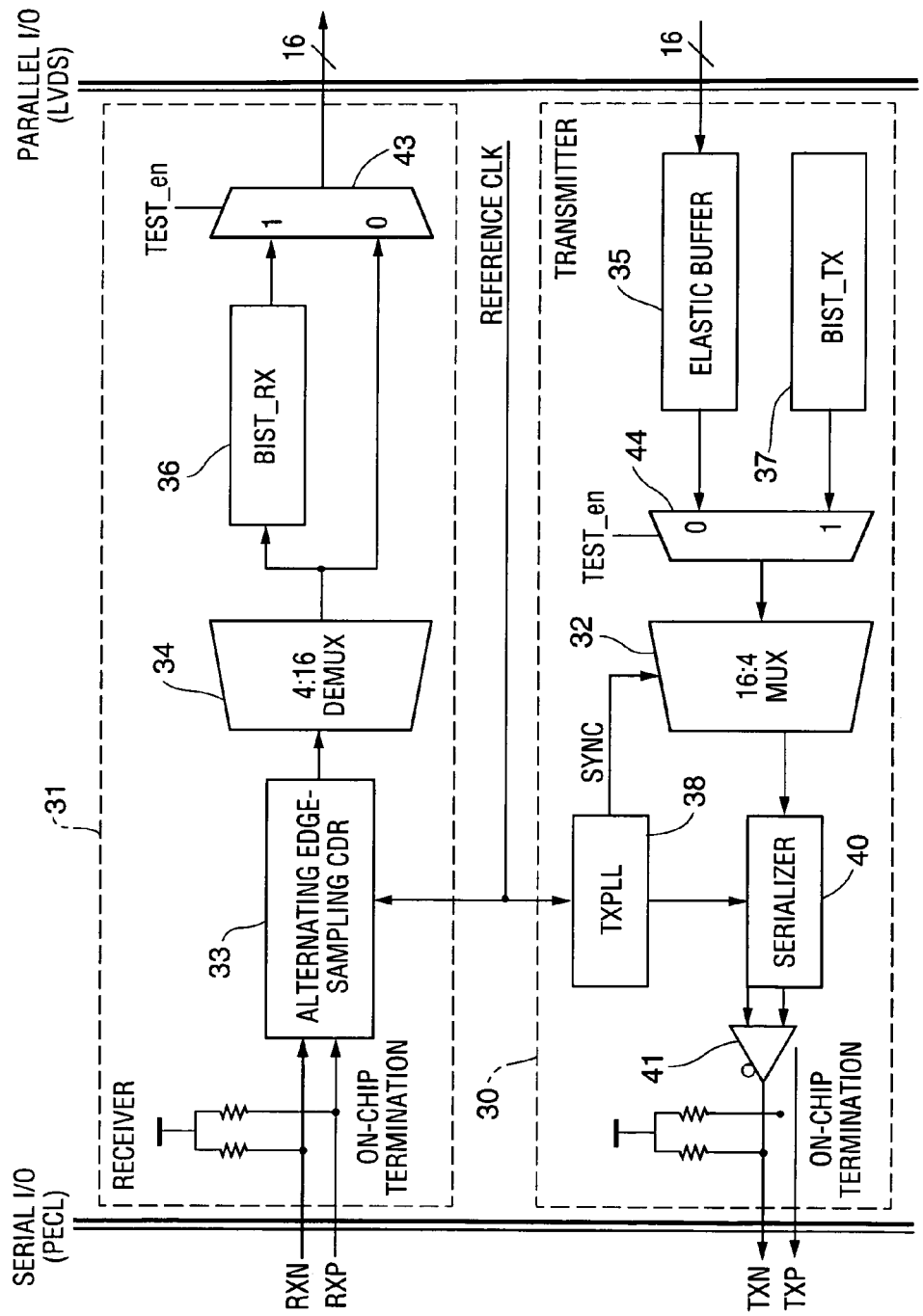
FIG. 5 is a block diagram of a transceiver that embodies the invention, in which alternating edge-sampling CDR 33 is implemented as shown in FIG. 3(a).

A fully integrated test circuit for the inventive CDR can have the structure shown in FIG. 5. In this test circuit, the CDR is a transceiver which includes transmitter circuitry 30 and receiver circuitry 31. Transmitter circuitry 30 serializes 16-bit parallel data into one pair of PECL level signals (TXN and TXP, indicative of a serial differential signal) via 16:4 MUX 32, serializer 40, and output driver 41, connected as shown. Preferably, a current mode driver adopting inductive load is used for bandwidth boosting, for example as described in M. M. Green, et al., "OC-192 Transmitter in Standard 0.18 μm CMOS," ISSCC Digest of Technical Papers, pp. 248-249, February 2002. In receiver circuitry 31, serial input (RXN and RXP, indicative of a serial differential signal) is recovered as 16-bit parallel data through an embodiment of the inventive AES CDR (circuit 33) and 4:16 DEMUX 34, connected as shown. An LVDS interface can be used for I/O of the parallel data.

Transmitter 30 includes a phase lock loop circuit (TXPLL 38) for generating internal clock and sync signals in response to external reference clock ("Reference CLK"). AES CDR 33 also includes a phase lock loop for generating clock signals ixCLK and idCLK signals in response to the external reference clock.

To resolve an asynchronous clock boundary problem, elastic buffers 35 are used in the transmitter. For the convenience of measurement, built-in self test ("BIST") circuitry ("BIST_RX" 36 in the receiver; "BIST_TX" 37 in the transmitter) is also included. The BIST circuitry supports jitter and BER testing for various data patterns including a pseudo-random bit stream ("PRBS") data sequence. Multiplexer 43 selects the output of BIST_RX 36 in a test mode and otherwise selects the output of demultiplexer 34. Multiplexer 44 selects the output of BIST_TX 37 in a test mode and otherwise selects the output of buffers 35.

The test circuit of FIG. 5 has been fabricated as an integrated circuit with a 0.18 μm CMOS process (a 0.18 μm, 1-Poly, 4-Metal CMOS process) and packaged with 144-pin chip array BGA, with a pad-limited die size of 2.8×2.8 mm, and an active area of 0.5×1.5 mm².

The transceiver of the integrated circuit implementation of the FIG. 5 operates (during generation of samples at a rate in the range from 2.5 Gbps to 11.5 Gbps) with a bit error rate (BER) of less than $10^{-12}$. During a test, when the receiver of the chip was locked to 10 Gbps PRBS input data, it employed a sample clock having 2.5 ps RMS and 21 ps P-P jitter to recover serial data having 5.2 ps RMS and 34 ps P-P jitter. During a test, when the receiver of the chip was locked to 2.5 Gbps PRBS input data, it employed a sample clock having 3.9 ps RMS and 38 ps P-P jitter to recover serial data having 7.6 ps RMS and 52 ps P-P jitter. The chip consumes 540 mW from a 1.8V supply when operating at 10 Gbps. The power dissipation is reduced to 340 mW when operating at 2.5 Gbps.

We next describe additional aspects of the invention.

Because a binary PD has a non-linear characteristic, it is hard to apply a linear PLL theory to a CDR in which the binary PD is used. But in a noisy environment, the input data has probabilistic distribution, and the inventors have recognized that this makes it possible to analyze the characteristic of the binary PD using random process theory.

Figure 6A:
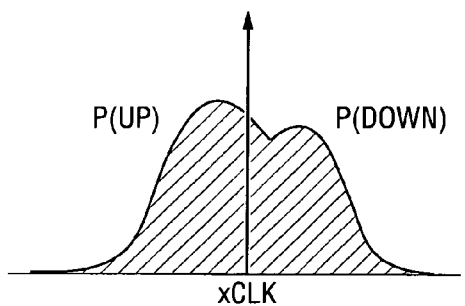
FIG. 6(a) shows an edge sampling clock (of a conventional binary PD) and the input data transition probability density function (PDF) in a lock state of the binary PD, assuming no phase error ($\phi_A$) between the data sampling clock (not shown) and data.
Figure 6B:
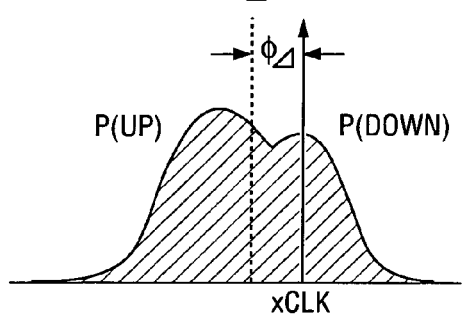
FIG. 6(b) shows an edge sampling clock of the binary PD of FIG. 6(a) and the input data transition PDF of such binary PD, assuming nonzero phase error between the data sampling clock (not shown) and data.

FIG. 6(a) shows an edge sampling clock of a conventional binary PD and the input data transition probability density function (PDF) in a lock state, assuming no phase error ($\phi_\Delta$) between the sampling clock and data. FIG. 6(b) shows an edge sampling clock of the conventional binary PD and the input data transition PDF, assuming nonzero phase error ($\phi_\Delta$) between the sampling clock and data. The expressions P(up) and P(down) denote the probability of an up decision (to advance the phase of the sampling clock) and a down decision (to retard the phase of the sampling clock), respectively.

Under the conditions of FIG. 6(a), the binary PD is locked when P(up) is equal to P(down), and the average pumping current is equal to zero. But if there is some phase error between the sampling clock and the input data as shown in FIG. 6(b), the average pumping current changes to $$I_{avg} = I_P\alpha_T(P(\text{up}) - P(\text{down})) \quad (1)$$
$$= I_P\alpha_T\left(\int_{-\infty}^{\phi_\Delta} f(x)dx - \int_{\phi_\Delta}^{\infty} f(x)dx\right),$$

where $I_P$, $\alpha_T$, and $f(x)$ are a charge pump current, data transition rate, and data transition PDF, respectively. The phase detector gain ($K_{PD}$) is a slope of the $I_{avg}$–$\phi_\Delta$ curve, and can be expressed as follows.

$$K_{PD} = \left.\frac{\partial I_{avg}}{\partial \phi_\Delta}\right|_{\phi_\Delta=0} \quad (2)$$
$$= I_P\alpha_T[(f(\phi_\Delta) - f(-\infty)) - (f(\infty) - f(\phi_\Delta))]|_{\phi_\Delta=0}$$
$$= 2I_P\alpha_T f(0)$$

Equation (2) implies that $K_{PD}$ depends on the data transition PDF (i.e., the PDF of input jitter). Because f(0) is inversely proportional to the jitter amplitude, the PD gain $K_{PD}$ is also inversely proportional to the jitter. For example, if the input jitter is purely Gaussian, the resulting $K_{PD}$ is $$K_{PD} = \frac{2\alpha_T}{\sigma\sqrt{2\pi}}, \quad (3)$$

where σ is the RMS value of the jitter.

A dead-zone binary PD based on 3× oversampling technique was proposed in the above-cited paper by Y. Moon, et al. Applying the same method used in the two previous paragraphs, a gain ($K_{PD}$) of a dead-zone PD can be described in closed form.

Figure 7A:
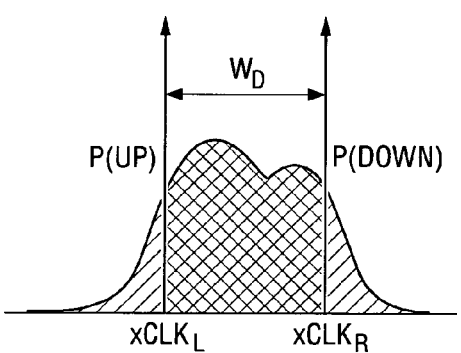
FIG. 7(a) shows an edge sampling clock (of a dead zone PD) and the input data transition PDF in a lock state of the dead zone PD, assuming no phase error ($\phi_A$) between the data sampling clock (not shown) and data.
Figure 7B:
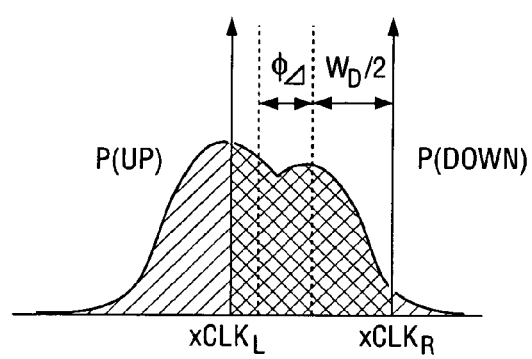
FIG. 7(b) shows an edge sampling clock of the dead zone PD of FIG. 7(a) and the input data transition PDF of such dead zone PD, assuming nonzero phase error between the data sampling clock (not shown) and data.

FIGS. 7(a) and 7(b) show an edge sampling clock and data transition PDF for a conventional dead-zone PD, assuming zero and nonzero phase error ($\phi_\Delta$), respectively. The average pumping current for phase error of $\phi_\Delta$ is $$I_{avg} = I_P\alpha_T(P(\text{up}) - P(\text{down})) \quad (4)$$
$$= I_P\alpha_T\left(\int_{-\infty}^{\phi_\Delta - W_D/2} f(x)dx - \int_{\phi_\Delta + W_D/2}^{\infty} f(x)dx\right),$$

where $W_D$ is a width of dead-zone. The PD gain can be found by differentiating equation (4):

$$K_{PD} = \left.\frac{\partial I_{avg}}{\partial \phi_\Delta}\right|_{\phi_\Delta=0} \quad (5)$$
$$= I_P\alpha_T[(f(\phi_\Delta - W_D/2) - f(-\infty)) -$$
$$(f(\infty) - f(\phi_\Delta + W_D/2))]|_{\phi_\Delta=0}$$
$$= I_P\alpha_T(f(W_D/2) + f(-W_D/2))$$

As apparent from equation (5), the gain of dead-zone PD is also dependent on the jitter PDF. If the width of dead-zone is wide enough to locate its boundaries at tails of jitter PDF, the gain $K_{PD}$ is inversely proportional to the jitter amplitude just as in a conventional binary PD.

The PD of the invention controls its width to track the jitter amount by locating the dead-zone boundaries in jitter tails. A charge pump current, $I_P$ is also controlled to be proportional to dead-zone width, so that gain $K_{PD}$ can be kept constant in spite of jitter variations.

Figure 8:
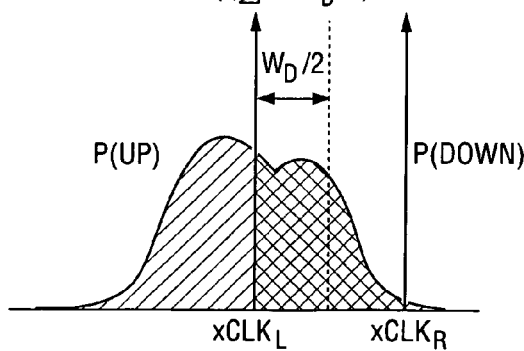
FIG. 8 shows an edge sampling clock of an embodiment of the inventive PD, and the input data transition PDF of such PD, assuming nonzero phase error ($\phi_A$) between the data sampling clock (not shown) and data being sampled.

FIG. 8 shows an edge sampling clock and data transition PDF for an embodiment of the inventive PD, assuming non-zero phase error ($\phi_\Delta$). The PD gain is already described in equation (5), but the PDF of jitter distribution is hard to know in the real world. Instead, an approximation of $K_{PD}$ between $\phi_\Delta=0$ and $\phi_\Delta=W_D/2$ can be used to verify the inventive PD.

When $\phi_A=W_D/2$, the sampling clocks and the data edge distributions are located as shown in FIG. 8. Then, the average pumping current is $$I_{avg} = I_P \alpha_T (P(\text{up}) - P(\text{down})) \quad (6)$$

$$\approx \frac{1}{2} I_P \alpha_T, \left( \because P(\text{up}) = \frac{1}{2}, P(\text{up}) \gg P(\text{down}) \right)$$

So, the approximated PD gain is:

$$K'_{PD} = \frac{I_{avg}}{W_D/2} = \frac{I_P \alpha_T}{W_D}. \quad (7)$$

Because $I_P$ is proportional to $W_D$ in preferred embodiments of the inventive PD, $K_{PD}'$ is constant over various jitter conditions.

A ring oscillator type VCO is preferably used for multiphase clocking when implementing the invention. To make the VCO have enough range to cover PVT (process, voltage, and temperature) variations while keeping a small gain for a low jitter, a dual control path scheme similar to that described in J. Savoj, et al., "A 10-Gb/s CMOS Clock and Data Recovery Circuit with a Half-Rate Linear Phase Detector," J. Solid-State Circuits, vol. 36, pp. 761-767, May 2001 and shown in FIGS. 9(a) and 9(b), is employed in preferred embodiments of the invention (including that to be described with reference to FIGS. 9(a) and 9(b).

Figure 9A:
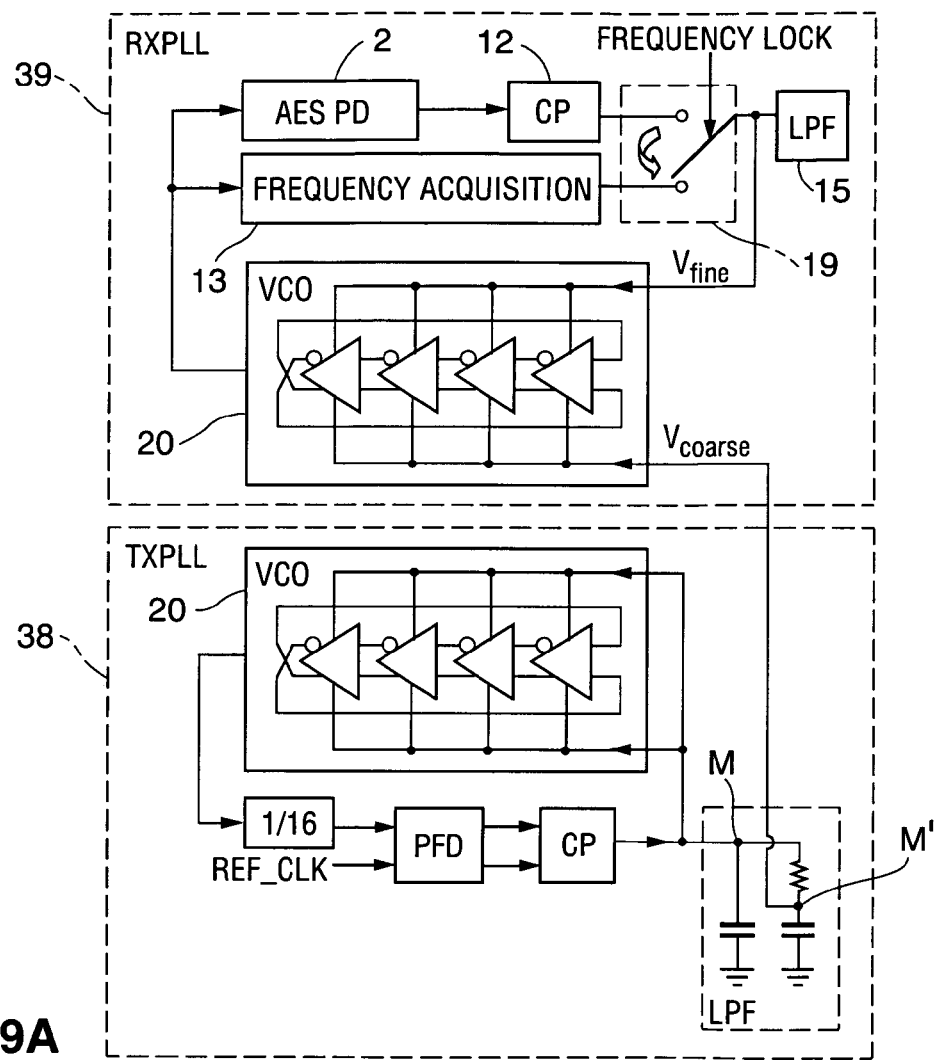
FIG. 9(a) is a block diagram of some elements of a transceiver that includes an embodiment of the inventive CDR, with simplified schematic diagrams of preferred implementations of VCOs 20. PLL 38 of FIG. 9(a) (identified as "TXPLL") is included in the transmitter portion of the transceiver, and PLL 39 (identified as "RXPLL") is included in the CDR portion of the transceiver.

FIG. 9(a) is a block diagram of some elements of a transceiver that includes an embodiment of the inventive CDR, with simplified schematic diagrams of preferred implementations of VCOs 20. PLL 38 of FIG. 9(a) (identified as "TXPLL") is included in the transmitter portion of the transceiver, and PLL 39 (identified as "RXPLL") is included in the CDR portion of the transceiver. PLL 39 includes elements 2, 12, 13, 15, 19, and a preferred implementation of VCO 20 of FIG. 3(a), connected as shown.

With reference to FIG. 9(a), VCO 20 in TXPLL 38 is coupled (as shown) to receive different control voltages than is VCO 20 in RXPLL 39. A coarse control voltage ($V_{coarse}$) for RXPLL 39 is fed (to VCO 20 in RXPLL 39) from node M' of the low pass filter (LPF) of TXPLL 38. A fine control voltage ($V_{fine}$) for RXPLL 39 is fed (to VCO 20 in RXPLL 39) from node M of low pass filter 15 of RXPLL 38. A single control voltage is fed (to VCO 20 of TXPLL 38) from node M of the low pass filter (LPF) of TXPLL 38.

Figure 9B:
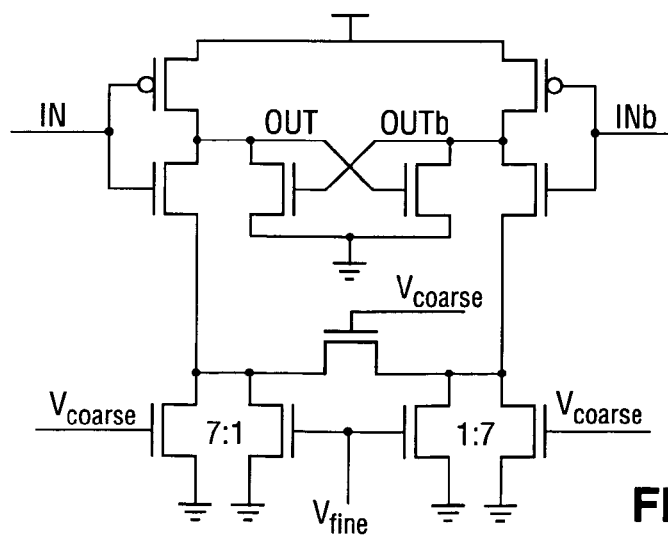
FIG. 9(b) is a single stage delay cell of VCO 20 of RXPLL 39 of FIG. 9(a).

FIG. 9(b) is a schematic diagram of a single stage delay cell of VCO 20 of RXPLL 39 of FIG. 9(a). The delay cell is of a folded starved inverter type for low jitter. In response to the clock signals "in" and its complement "inb," the cell generates the output clock signals "out" and its complement "outb."

Figure 10:
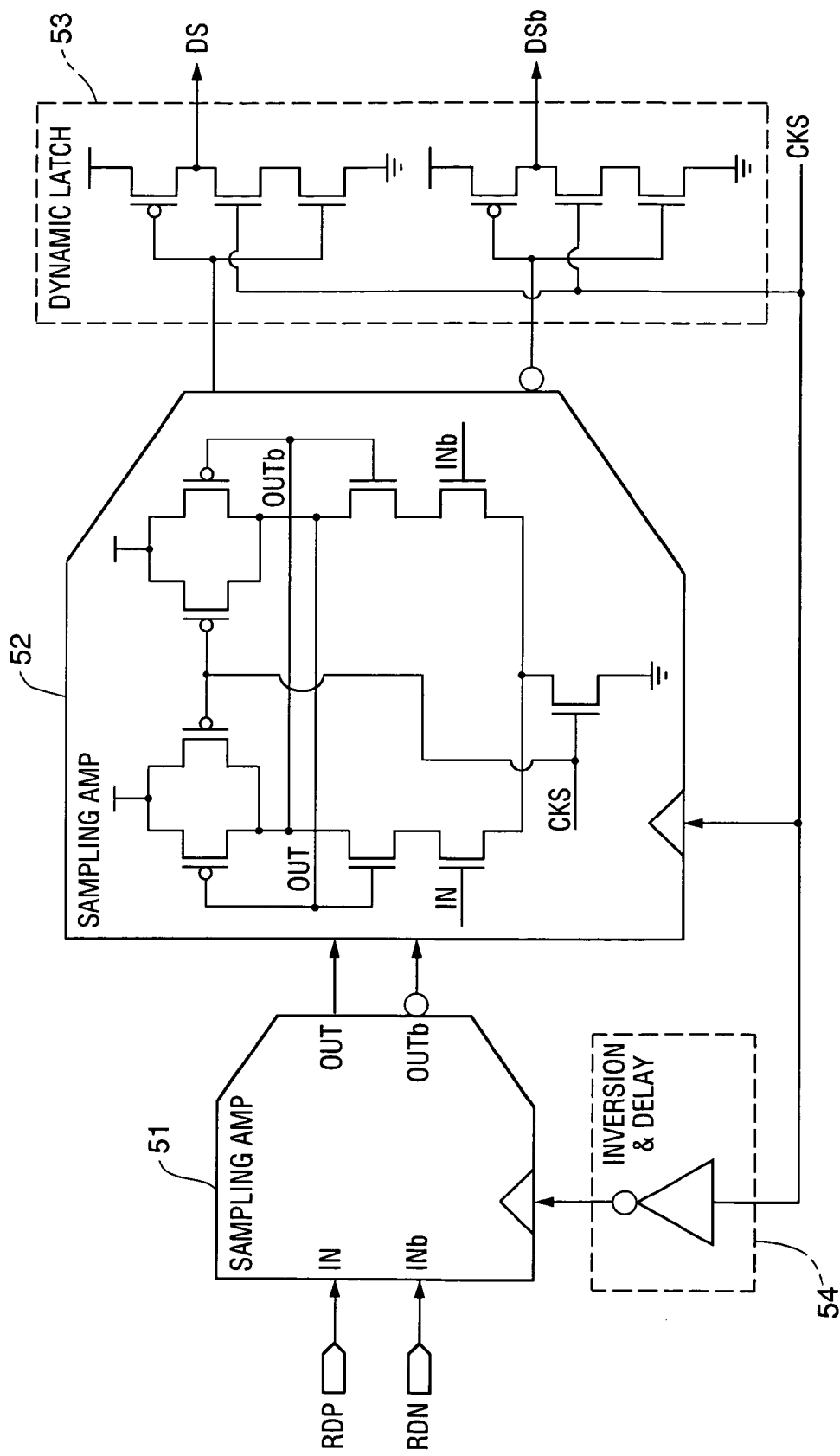
FIG. 10 is a schematic diagram of a cascaded sampler employed in preferred embodiments of the invention.

The inventive CDR can operate at a frequency equal to one quarter of the sample rate (i.e., the combined rate at which the samples of sample streams DS[0:3] are asserted can be four times the frequency of each of clocks ixCLK and idCLK). Since AES PD 2 of FIG. 3(a) modulates the edge sampling clock, the CDR of FIG. 3(a) preferably operates at 2.5 GHz for a 10 Gbps data rate. To minimize the probability of a metastable state, each sampler (e.g., sampler circuits 6 and 8 of FIG. 3(a)) preferably includes cascaded sense amps (51 and 52), a dynamic latch (53), and an inversion and delay circuit (54), connected as shown in FIG. 10. First stage sampling amp 51 operates at the falling edge of CKS (i.e., xCLK or dCLK of FIG. 3(a)), while second stage sampling amp 52 operates at the rising edge of CLK. Inverter delay circuit 54 in the sampling clock path ensures stable pre-charge and evaluation operation of each sampling amp stages.

Another aspect of the invention is a method for sampling of data having jitter, including the steps of: (a) generating at least one sampling clock in response to a charge pump current, where at least one said sampling clock is a data sampling clock and the charge pump current determines the phase of the data sampling clock; (b) generating data samples by sampling the data using the data sampling clock; and (c) generating the charge pump current in response to feedback, where the feedback is indicative of phase error between the data sampling clock and the data, the feedback is also indicative of the jitter, the charge pump current has an average current value that is at least substantially independent of the amount of the jitter over each time interval over which $\phi_{av}$ is nonzero, where $\phi_{av}$ is an average of instantaneous values of said phase error over the time interval, and the average current value is an average of instantaneous values of the charge pump current over said time interval. Typically, the charge pump current is a positive current ($I_P$) when the phase error is negative, the charge pump current is a negative current, $-(I_P)$, when the phase error is positive, and step (c) includes the step of controlling the absolute value of the charge pump current to cause said absolute value be proportional to the jitter. Preferably, another sampling clock generated during step (a) is a first clock whose phase is determined by the charge pump current, and step (c) includes the steps of: modulating the first clock to generate an edge sampling clock such that the edge sampling clock defines a dead zone having a dead zone width; generating additional samples of the data in response to the edge sampling clock; and generating the feedback in response to the data samples and the additional data samples. In some embodiments, the data determines a data eye, and step (c) includes the step of automatically adjusting the dead zone width to cause edges of the dead zone to track boundaries of the data eye.

It should be understood that while some embodiments of the present invention are illustrated and described herein, the invention is defined by the claims and is not to be limited to the specific embodiments described and shown.

What is claimed is:

1. A clock and data recovery device for generating data samples in response to data having jitter, said device including:

sampling circuitry coupled and configured to receive the data and to employ 2× oversampling using a data sampling clock and an edge sampling clock to generate the data samples;

clock generation circuitry configured to generate the data sampling clock in response to at least one control signal and to assert the data sampling clock to the sampling circuitry, wherein the phase of said data sampling clock is determined by the control signal;

phase detection circuitry configured to generate feedback indicative of the amount of the jitter and of phase error between the data sampling clock and the data; and clock control circuitry, coupled and configured to generate the control signal in response to the feedback and to assert the control signal to the clock generation circuitry, wherein the control signal is at least substantially independent of the amount of the jitter over each time interval over which $\phi_{av}$ is nonzero, where $\phi_{av}$ is an average of instantaneous values of the phase error between the data sampling clock and the data over the time interval, wherein the clock generation circuitry is configured to generate a second clock whose phase is fixed relative to the data sampling clock in response to said at least one control signal and to generate the edge sampling clock by applying variable delay to the second clock such that the edge sampling clock has a varying phase that defines a dead zone having a dead zone width, and wherein the feedback includes a jitter signal indicative of the amount of the jitter, the clock control circuitry includes a dead zone width control circuit configured to generate the jitter signal, and the clock generation circuitry is configured to adjust the dead zone width in response to the jitter signal.

2. The device of claim 1, wherein the clock generation circuitry is a voltage controlled oscillator, the clock control circuitry includes a charge pump circuit, and the charge pump circuit is configured to generate a charge pump current in response to the feedback and to generate the control signal in response to the charge pump current, wherein the charge pump current has an average current value, $I_{avg}$, that is at least substantially independent of the amount of the jitter over said each time interval over which $\phi_{av}$ is nonzero, where $I_{avg}$ is an average of instantaneous values of the charge pump current over the time interval.

3. The device of claim 2, wherein the charge pump circuit is configured to generate the charge pump current such that said charge pump current has an absolute value that is proportional to the amount of the jitter.

4. The device of claim 2, wherein the average current value, $I_{avg}$, is independent of the amount of the jitter over said each time interval over which $\phi_{av}$ is nonzero.

5. The device of claim 2, wherein the feedback is indicative of a sequence of control bit pairs, a first bit in each of the pairs is indicative of whether the phase error between the data sampling clock and the data is positive, a second bit in each of the pairs is indicative of whether said phase error is negative, and the charge pump circuit includes:
   a first node coupled to receive a first signal indicative of the first bit of each of the control bit pairs;
   a second node coupled to receive a second signal indicative of the second bit of each of the control bit pairs;
   delay circuitry coupled to receive the first signal and the second signal and configured to assert in response thereto a first delayed signal indicative of the first bit of each of the control bit pairs and a second delayed signal indicative of the second bit of each of the control bit pairs;
   a third node; and
   additional circuitry, coupled to the first node, the second node, the delay circuitry, and the third node, and configured to source a positive current to the third node when one of the control bit pairs indicates positive phase error but does not indicate negative phase error between the data sampling clock and the data, and to sink a current from the third node when one of the control bit pairs indicates negative phase error but does not indicate positive phase error between the data sampling clock and the data.

6. The device of claim 5, wherein the second signal is indicative of the complement of the second bit of each of the charge pump control bit pairs, the delay circuitry includes a first inverter whose input is the first node and a second inverter whose input is the second node, the first inverter has an output coupled to assert the first delayed signal to the additional circuitry, and the second inverter has an output coupled to assert the second delayed signal to the additional circuitry.

7. The device of claim 1, wherein the data defines a data eye and the clock generation circuitry is configured to adjust the dead zone width in response to the jitter signal to cause edges of the dead zone to track boundaries of the data eye.

8. The device of claim 1, wherein the clock generation circuitry is configured to generate a third clock and to generate the data sampling clock by applying variable delay to the third clock, and
   the dead zone width control circuit is configured to generate a sequence of counts and to generate the jitter signal in response to the sequence of counts, wherein each of the counts is indicative of the number of times that the clock generation circuitry changes the phase of the third clock during a predetermined number of valid transitions of the data.

9. The device of claim 8, wherein the clock generation circuitry is configured to increase the dead zone width in response to values of the jitter signal indicative of an increasing sequence of the counts, and to decrease the dead zone width in response to values of the jitter signal indicative of a decreasing sequence of the counts.

10. A clock and data recovery device for generating data samples in response to data having jitter, said device including:
   sampling circuitry coupled and configured to receive the data and to employ 2× oversampling using a data sampling clock and an edge sampling clock to generate the data samples;
   clock generation circuitry configured to generate the data sampling clock in response to a charge pump current and to assert the data sampling clock to the sampling circuitry, wherein the phase of said data sampling clock is determined by the charge pump current; and
   clock control circuitry, coupled and configured to generate feedback indicative of the amount of the jitter and of phase error between the data sampling clock and the data, to generate the charge pump current in response to the feedback, and to assert at least one of the charge pump current, and a control signal determined by the charge pump current, to the clock generation circuitry, wherein the charge pump current has an average current value, $I_{avg}$, that is at least substantially independent of the amount of the jitter over each time interval over which $\phi_{av}$ is nonzero, where $\phi_{av}$ is an average of instantaneous values of the phase error between the data sampling clock and the data over the time interval, and $I_{avg}$ is an average of instantaneous values of the charge pump current over said time interval, wherein the clock generation circuitry is configured to generate a second clock whose phase is fixed relative to the data sampling clock in response to the charge pump current and to generate the edge sampling clock by applying variable delay to the second clock such that the edge sampling clock has a varying phase that defines a dead zone having a dead zone width, and wherein the feedback includes a jitter signal indicative of the amount of the jitter, the clock control circuitry includes a dead zone width control circuit configured to generate the jitter signal, and the clock generation circuitry is configured to adjust the dead zone width in response to the jitter signal.

11. The device of claim 10, wherein the average current value, $I_{avg}$, is independent of the amount of the jitter over said each time interval over which $\phi_{av}$ is nonzero.

12. The device of claim 10, wherein the clock control circuitry is configured to generate the charge pump current such that said charge pump current has an absolute value that is proportional to the amount of the jitter.

13. The device of claim 10, wherein the data defines a data eye and the clock generation circuitry is configured to adjust the dead zone width in response to the jitter signal to cause edges of the dead zone to track boundaries of the data eye.

14. The device of claim 10, wherein the clock control circuitry is configured to generate the charge pump current in response to the jitter signal such that said charge pump current has an absolute value that is proportional to the amount of the jitter.

15. The device of claim 10, wherein the clock control circuitry is configured to generate the charge pump current in response to the jitter signal such that the average current value, $I_{avg}$, is at least substantially independent of the amount of the jitter and the dead zone width.

16. The device of claim 10, wherein the clock generation circuitry is configured to generate a third clock and to generate the data sampling clock by applying variable delay to the third clock, and the dead zone width control circuit is configured to generate a sequence of counts and to generate the jitter signal in response to the sequence of counts, wherein each of the counts is indicative of the number of times that the clock generation circuitry changes the phase of the third clock during a predetermined number of valid transitions of the data.

17. The device of claim 16, wherein the clock generation circuitry is configured to increase the dead zone width in response to values of the jitter signal indicative of an increasing sequence of the counts, and to decrease the dead zone width in response to values of the jitter signal indicative of a decreasing sequence of the counts.

18. The device of claim 10, wherein the clock generation circuitry is a voltage controlled oscillator, and the clock control circuitry is configured to assert a control voltage, determined by the charge pump current, to the clock generation circuitry.

19. The device of claim 10, wherein the feedback is indicative of a sequence of control bit pairs, a first bit in each of the pairs is indicative of whether the phase error between the data sampling clock and the data is positive, a second bit in each of the pairs is indicative of whether said phase error is negative, the clock control circuitry includes a charge pump circuit configured to generate the charge pump current, and the charge pump circuit includes:

a first node coupled to receive a first signal indicative of the first bit of each of the control bit pairs;

a second node coupled to receive a second signal indicative of the second bit of each of the control bit pairs;

delay circuitry coupled to receive the first signal and the second signal and configured to assert in response thereto a first delayed signal indicative of the first bit of each of the control bit pairs and a second delayed signal indicative of the second bit of each of the control bit pairs;

a third node; and additional circuitry, coupled to the first node, the second node, the delay circuitry, and the third node, and configured to source a positive current to the third node when one of the control bit pairs indicates positive phase error but does not indicate negative phase error between the data sampling clock and the data, and to sink a current from the third node when one of the control bit pairs indicates negative phase error but does not indicate positive phase error between the data sampling clock and the data.

20. The device of claim 19, wherein the second signal is indicative of the complement of the second bit of each of the charge pump control bit pairs, the delay circuitry includes a first inverter whose input is the first node and a second inverter whose input is the second node, the first inverter has an output coupled to assert the first delayed signal to the additional circuitry, and the second inverter has an output coupled to assert the second delayed signal to the additional circuitry.

21. A clock and data recovery device for generating data samples in response to data having jitter, said device including:

sampling circuitry coupled and configured to receive the data and to employ 2× oversampling using a data sampling clock and an edge sampling clock to generate the data samples;

clock generation circuitry configured to generate the data sampling clock in response to a charge pump current and to assert the data sampling clock to the sampling circuitry, wherein the phase of said data sampling clock is determined by the charge pump current; and clock control circuitry coupled and configured to generate feedback indicative of the amount of the jitter and of phase error between the data sampling clock and the data, to generate the charge pump current in response to the feedback, and to assert at least one of the charge pump current, and a control signal determined by the charge pump current, to the clock generation circuitry, wherein the charge pump current has an average current value, $I_{avg}$, that is at least substantially independent of the amount of the jitter over each time interval over which $\phi_{av}$ is nonzero, where $\phi_{av}$ is an average of instantaneous values of the phase error between the data sampling clock and the data over the time interval, and $I_{avg}$ is an average of instantaneous values of the charge pump current over said time interval, wherein the clock control circuitry includes a charge pump circuit configured to generate the charge pump current, the device also includes a frequency acquisition loop coupled to receive a reference clock having a reference frequency, and the device is operable in a frequency locking mode in which the charge pump circuit is decoupled from the clock generation circuitry and the frequency acquisition loop is coupled to the clock generation circuitry, the frequency acquisition loop generates a clock control signal in response to the reference clock and the data sampling clock, and the frequency acquisition loop asserts the clock control signal to the clock generation circuitry to cause the frequency of the data sampling clock to match the reference frequency.

22. A clock and data recovery device for generating data samples in response to data having jitter and defining a data eye, wherein the data has a bit period, said device including:

a data loop; and a dead zone width control loop, wherein the data loop includes sampling circuitry and clock generation circuitry, the sampling circuitry is coupled and configured to receive the data and employ 2× oversampling using a data sampling clock and an edge sampling clock to generate the data samples, and the clock generation circuitry is configured to generate a first clock having a first variable phase and second clock having second variable phase, to maintain the difference between the first variable phase and the second variable phase at a value at least substantially equal to 180 degrees, where 180 degrees corresponds to one half of the bit period, to generate the data sampling clock by delaying the first clock by a first variable delay, to maintain the phase of the data sampling clock at the center of the data eye, and to generate the edge sampling clock by applying a sequence of second and third variable delays to the second clock, where the difference between each of the second variable delays and the first variable delay contemporaneous therewith is a fixed positive value, and the difference between each of the third variable delays and the first variable delay contemporaneous therewith is a fixed negative value, so that the edge sampling clock has a varying phase that defines a dead zone having a dead zone width, wherein the clock generation circuitry is configured to generate the first clock in response to a control signal such that phase of said data sampling clock is determined by the control signal, and the data loop is configured to operate in response to the edge sampling clock and the data samples to generate feedback indicative of the amount of the jitter and of phase error between the data sampling clock and the data, and to generate the control signal in response to the feedback such that the control signal is at least substantially independent of the amount of the jitter over each time interval over which $\phi_{av}$ is nonzero, where $\phi_{av}$ is an average of instantaneous values of the phase error between the data sampling clock and the data over the time interval, and wherein the dead zone width control loop is configured to generate a jitter signal in response to the feedback and to control generation of the edge sampling clock in response to the jitter signal to cause edges of the dead zone to track boundaries of the data eye, wherein the jitter signal is indicative of the amount of the jitter.

23. The device of claim 22, wherein the clock generation circuitry is a voltage controlled oscillator, the clock control circuitry includes a charge pump circuit, and the charge pump circuit is configured to generate a charge pump current in response to the feedback and to generate the control signal in response to the charge pump current, and wherein the dead zone width control loop is configured to control generation of the charge pump current in response to the jitter signal such that said charge pump current has an absolute value that is proportional to the amount of the jitter.

24. The device of claim 23, wherein the charge pump current has an average current value, $I_{avg}$, that is an average of instantaneous values of the charge pump current over said each time interval over which $\phi_{av}$ is nonzero, and wherein the dead zone width control loop is configured to control generation of the charge pump current in response to the jitter signal such that the average current value, $I_{avg}$, is at least substantially independent of the amount of the jitter and the dead zone width over said each time interval over which $\phi_{av}$ is nonzero.

25. The device of claim 22, wherein the feedback is indicative of a sequence of control bit pairs, a first bit in each of the pairs is indicative of whether the phase error between the data sampling clock and the data is positive, a second bit in each of the pairs is indicative of whether said phase error is negative, and the charge pump circuit includes:
a first node coupled to receive a first signal indicative of the first bit of each of the control bit pairs;
a second node coupled to receive a second signal indicative of the second bit of each of the control bit pairs;
delay circuitry coupled to receive the first signal and the second signal and configured to assert in response thereto a first delayed signal indicative of the first bit of each of the control bit pairs and a second delayed signal indicative of the second bit of each of the control bit pairs;
a third node; and
additional circuitry, coupled to the first node, the second node, the delay circuitry, and the third node, and configured to source a positive current to the third node when one of the control bit pairs indicates positive phase error but does not indicate negative phase error between the data sampling clock and the data, and to sink a current from the third node when one of the control bit pairs indicates negative phase error but does not indicate positive phase error between the data sampling clock and the data.

26. The device of claim 25, wherein the second signal is indicative of the complement of the second bit of each of the charge pump control bit pairs, the delay circuitry includes a first inverter whose input is the first node and a second inverter whose input is the second node, the first inverter has an output coupled to assert the first delayed signal to the additional circuitry, and the second inverter has an output coupled to assert the second delayed signal to the additional circuitry.

27. The device of claim 22, the dead zone width control circuit is configured to generate a sequence of counts and to generate the jitter signal in response to the sequence of counts, wherein each of the counts is indicative of the number of times that the clock generation circuitry changes the phase of the second signal during a predetermined number of valid transitions of the data.

28. The device of claim 27, wherein the clock generation circuitry is configured to increase the dead zone width in response to values of the jitter signal indicative of an increasing sequence of the counts, and to decrease the dead zone width in response to values of the jitter signal indicative of a decreasing sequence of the counts.

29. The device of claim 22, wherein the data sampling clock has frequency equal to f/N, where f is the bit rate of the data, and N is an integer greater than one.

30. A jitter estimating circuit for use in an clock and data recovery device configured to generate samples of data having jitter using a data sampling clock, where the clock and data recovery device is configured to generate the data sampling clock by applying variable delay to a first clock in response to feedback indicative of phase error between the data sampling clock and the data, wherein the clock and data recovery device is configured to generate a second clock whose phase is fixed relative to the data sampling clock and to generate an edge sampling clock by applying variable delay to the second clock such that the edge sampling clock has a varying phase that defines a dead zone having a dead zone width, said circuit including:
counter circuitry configured to generate a sequence of counts in response to the feedback, wherein each of the counts is indicative of the number of times that the clock and data recovery device changes the phase of the first clock during a predetermined number of valid transitions of the data;
decision logic, coupled to the counter circuitry and configured to generate code words in response to the counts, wherein the counts have values in a range of count values, the range is partitioned into segments, and each of the code words is generated in response to one of the counts and indicates one of the segments to which said one of the counts belongs; and
additional circuitry coupled to the decision logic and configured to generate at least one dead zone width control signal in response to the code words.

31. The circuit of claim 30, wherein the range of count values is partitioned into five segments.

32. The circuit of claim 30, wherein the range of count values is partitioned into at least three segments, and
the additional circuitry has a state in which it generates the dead zone width control signal to have a value indicating that the dead zone width should decrease in response to each of the code words indicating one of counts in a first one of the segments, generates the dead zone width control signal to have a value indicating that the dead zone width should not change in response to each of the code words indicating one of counts in a second one of the segments, and generates the dead zone width control signal to have a value indicating that the dead zone width should increase in response to each of the code words indicating one of counts in a third one of the segments.

33. A transceiver, including:

transmitter circuitry; and receiver circuitry coupled and configured to receive data having jitter and defining a data eye, and including a clock and data recovery device for generating data samples in response to the data, said clock and data recovery device including a data loop and a dead zone width control loop, wherein the data has a bit period, and wherein the data loop includes sampling circuitry and clock generation circuitry, the sampling circuitry is coupled and configured to receive the data and employ 2× oversampling using a data sampling clock and an edge sampling clock to generate the data samples, and the clock generation circuitry is configured to generate a first clock having a first variable phase and second clock having second variable phase, to maintain the difference between the first variable phase and the second variable phase at a value at least substantially equal to 180 degrees, where 180 degrees corresponds to one half of the bit period, to generate the data sampling clock by delaying the first clock by a first variable delay, to maintain the phase of the data sampling clock at the center of the data eye, and to generate the edge sampling clock by applying a sequence of second and third variable delays to the second clock, where the difference between each of the second variable delays and the first variable delay contemporaneous therewith is a fixed positive value, and the difference between each of the third variable delays and the first variable delay contemporaneous therewith is a fixed negative value, so that the edge sampling clock has a varying phase that defines a dead zone having a dead zone width, wherein the clock generation circuitry is configured to generate the first clock in response to a control signal such that phase of said data sampling clock is determined by the control signal, and the data loop is configured to operate in response to the edge sampling clock and the data samples generated by the sampling circuitry to generate feedback indicative of the amount of the jitter and of phase error between the data sampling clock and the data, and to generate the control signal in response to the feedback such that the control signal is at least substantially independent of the amount of the jitter over each time interval over which $\phi_{av}$ is nonzero, where $\phi_{av}$ is an average of instantaneous values of the phase error between the data sampling clock and the data over the time interval, and wherein the dead zone width control loop is configured to generate a jitter signal in response to the feedback and to control generation of the edge sampling clock in response to the jitter signal to cause edges of the dead zone to track boundaries of the data eye, wherein the jitter signal is indicative of the amount of the jitter.

34. A method for sampling data having jitter, including the steps of:

(a) generating at least one sampling clock in response to a charge pump current, where at least one said sampling clock is a data sampling clock and the charge pump current determines the phase of the data sampling clock;

(b) generating data samples by sampling the data using the data sampling clock; and (c) generating the charge pump current in response to feedback, where the feedback is indicative of phase error between the data sampling clock and the data, the feedback is also indicative of the amount of the jitter, the charge pump current has an average current value that is at least substantially independent of the amount of the jitter over each time interval over which $\phi_{av}$ is nonzero, where $\phi_{av}$ is an average of instantaneous values of said phase error over the time interval, and the average current value is an average of instantaneous values of the charge pump current over said time interval, wherein another one of said at least one sampling clock generated during step (a) is a first clock whose phase is determined by the charge pump current, and wherein step (c) includes the steps of:

modulating the first clock to generate an edge sampling clock such that said edge sampling clock defines a dead zone having a dead zone width;

generating additional samples of the data in response to the edge sampling clock; and generating the feedback in response to the data samples and the additional data samples.

35. The method of claim 34, wherein the charge pump current is a positive current, $I_P$, when the phase error is negative, the charge pump current is a negative current, $-(I_P)$, when the phase error is positive, and step (c) includes the step of controlling the absolute value of the charge pump current to cause said absolute value be proportional to the jitter.

36. The method of claim 34, wherein the data determines a data eye, and step (c) includes the step of automatically adjusting the dead zone width to cause edges of the dead zone to track boundaries of the data eye.

* * * * *